(12) United States Patent
Shimizu et al.

(10) Patent No.: US 8,476,952 B2
(45) Date of Patent: Jul. 2, 2013

(54) MULTIPHASE MIXER

(75) Inventors: Yoshito Shimizu, Osaka (JP); Yohei Morishita, Tokyo (JP)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 13/146,085

(22) PCT Filed: Jan. 29, 2010

(86) PCT No.: PCT/JP2010/000556

§ 371 (c)(1),
(2), (4) Date: Jul. 25, 2011

(87) PCT Pub. No.: WO2010/087201

PCT Pub. Date: Aug. 5, 2010

(65) Prior Publication Data

US 2011/0279164 A1 Nov. 17, 2011

(30) Foreign Application Priority Data

Jan. 29, 2009 (JP) .................................. 2009-017899

(51) Int. Cl.
*H03H 11/16* (2006.01)

(52) U.S. Cl.
USPC .......................................... 327/231; 327/408

(58) Field of Classification Search
None
See application file for complete search history.

(56) References Cited

U.S. PATENT DOCUMENTS

| | | |
|---|---|---|
| 3,962,551 A | 6/1976 | Gay |
| 5,220,607 A | 6/1993 | Rebel |
| 2006/0040634 A1 | 2/2006 | Wang |
| 2007/0112904 A1 | 5/2007 | Kasperkovitz |
| 2008/0233906 A1* | 9/2008 | Mitomo et al. ............... 455/131 |

FOREIGN PATENT DOCUMENTS

| | | |
|---|---|---|
| JP | 55-095178 | 7/1980 |
| JP | 2004-289793 | 10/2004 |
| JP | 2005-536099 | 11/2005 |
| JP | 2007-535830 | 12/2007 |
| WO | 2008/032782 | 9/2007 |

OTHER PUBLICATIONS

Petrov, Andre R., "System Approach for Low 1/f Noise, High IP2 Dynamic Range CMOS Mixer Design", Proceedings of the 15$^{th}$ Biennial University/Government/Industry Microelectronics Symposium, Jun. 30-Jul. 2, 2003, pp. 74-77.

(Continued)

*Primary Examiner* — Cassandra Cox
(74) *Attorney, Agent, or Firm* — Greenblum & Bernstein, P.L.C.

(57) ABSTRACT

Disclosed is a mixer able to simultaneously suppress self-mixing and low-order harmonic response in a charge sampling circuit. Specifically disclosed is a multiphase mixer provided with a transconductance amplifier (101) for converting a voltage signal into a current signal, an N number (where N is a natural number that is 2 or more) of first integrators (401, 402) which are connected in parallel to the subsequent stage of the transconductance amplifier (101), and a 2N number of mixers (102, 103, 104, 105) connected in parallel in pairs to the respective N number of first integrators (401, 402), wherein two mixers connected to the same first integrator of any of the N number of first integrators (401, 402) are controlled by driving signals comprised of pulse trains with the same frequency and phases differing by 180°.

14 Claims, 23 Drawing Sheets

OTHER PUBLICATIONS

Morishita, Yohei et al., "Design of the Parallel Connection of Direct Sampling mixer", General Conference of the Institute of Electronics, Information and Communicatino Engineers, 2006, p. 55.

Bagheri, R. et al., "An 800MHz to 5GHz Software-Defined Radio Receiver in 90nm CMOS", Dig. Tech. Papers of the 2006 IEEE International Solid-State Circuits Conference (ISSCC), Feb. 2006.

Weldon, Jeffrey A. et al., "A 1.75GHz Highly Integrated Narrow-Based CMOS Transmitter with Harmonic-Rejection Mixers", IEEE Journal of Solid-State Circuits, vol. 36, No. 12, Dec. 2000, pp. 2003-2015.

Gang Xu et al., "Comparison of Charge Sampling and Voltage Sampling", Proceedings of the 43rd IEEE Midwest Symposium on Circuits and Systems, Aug. 8-11, 2000, pp. 440-443.

* cited by examiner

MULTIPHASE MIXER

TECHNICAL FIELD

The present invention relates to a self-mixing suppression technology for a mixer used in a high frequency processing section in a radio communication system, and a mixer harmonic response suppression technology.

BACKGROUND ART

A TV tuner needs to cover a wide reception band allocated to TV broadcast signals. For example, in Japan, a TV tuner needs to support VHF (Very High Frequency) channels (100 MHz band, 200 MHz band) and UHF (Ultra High Frequency) channels (470 MHz to 770 MHz). Also, a software radio needs to support a plurality of radio systems that use different radio bands.

In general, when a radio frequency signal of a frequency band that is an odd multiple of a local oscillation signal for driving a mixer is input to a mixer configuring a radio reception section, a disturbing signal frequency-converted to a frequency in the vicinity of received signal output having a desired frequency is output due to a nonlinear characteristic of the mixer. Also, in general, it is possible to suppress a harmonic response that is an even multiple of a local oscillation signal by giving a mixer a differential configuration, and using differential combining in subsequent-stage circuitry. However, if a radio frequency signal of a frequency band that is an even multiple of a local oscillation signal is input due to a mismatch between differential circuits, a disturbing signal frequency-converted to a frequency in the vicinity of received signal output having a desired frequency is output. Below, this disturbing signal is referred to as harmonic response.

Here, if a reception band that should be supported by a TV tuner or software radio is wide, and the ratio between signal amplitude when a signal of a desired frequency is received and signal amplitude of other than a desired frequency component output due to harmonic response reaches a predetermined value, reception sensitivity degrades. Thus, technology is known that suppresses harmonic response by approximating an output waveform to a sine wave (see Patent Literature 1 through Patent Literature 6, and Non-Patent Literature 1 and Non-Patent Literature 2).

Also, in recent years, with the object of simplifying the circuitry of a radio reception section, a direct conversion reception method whereby the output frequency of a high frequency processing mixer is set in the vicinity of zero hertz, or a Low-IF (Intermediate Frequency) reception method, have become mainstream. With these configurations, a local oscillation signal leaks to an RF input terminal of a mixer, this leakage component is reflected by a preceding-stage circuit and is input to the mixer again, and a DC component is output from the mixer. It is known that reception quality degrades due to fluctuation of the amplitude of this DC component. Below, this phenomenon is referred to as self-mixing.

In general, a reflection coefficient between a Low Noise Amplifier (LNA) connected ahead of a mixer and the mixer is changed by changing the LNA gain setting. Also, a reflection coefficient between an antenna and subsequent-stage circuitry changes according to a change in conditions around the antenna. The amplitude of a leakage component of a local oscillation signal fluctuates due to changes in these reflection coefficients. As a result, the amplitude of a DC (Direct Current) component fluctuates, causing degradation of reception sensitivity (self-mixing). A technology for suppressing this self-mixing is known whereby the ratio of an on-period to one cycle of a mixer driving signal (hereinafter referred to as the duty ratio) is made 25% (see Non-Patent Literature 3).

Also, in recent years there has been a technology called charge sampling, and charge sampling circuit 10 having a configuration such as shown in FIG. 1 is known (see Non-Patent Literature 4, for example). Switch 2 is subjected to on/off control by means of a control signal comprising a rectangular pulse input from control terminal 11, and a current output from current source 1 charges capacitative element 3 only while switch 2 is on.

A filter characteristic due to a current integration effect is obtained according to this charging period. Here, it is known that, among attenuation pole frequencies, a frequency closest to zero hertz changes according to the control signal duty ratio. Specifically, when the duty ratio is made N %, an attenuation pole is generated at a frequency position 100/N times the control signal (local oscillation signal) frequency.

CITATION LIST

Patent Literature

PTL 1
U.S. Pat. No. 3,962,551 specification
PTL 2
U.S. Pat. No. 5,220,607 specification
PTL 3
Japanese Patent Application Laid-Open No. SHO55-095178
PTL 4
Published Japanese Translation No. 2005-536099 of the PCT International Publication
PTL 5
Published Japanese Translation No. 2007-535830 of the PCT International Publication
PTL 6
International Publication No. 2008/032782
PTL 7
Japanese Patent Application Laid-Open No. 2004-289793

Non-Patent Literature

NPL 1
R. Bagheri, et al, "An 800 MHz to 5 GHz Software-Defined Radio Receiver in 90 nm CMOS", Dig. Tech. Papers of the 2006 IEEE International Solid-State Circuits Conference (ISSCC), February, 2006, pp. 480-481.
NPL 2
Weldon, J. A. et al, "A 1.75 GHz Highly-Integrated Narrow-Band CMOS Transmitter with Harmonic-Rejection Mixers", Section 10.4 of Dig. Tech. Papers of the 2001 IEEE ISSCC, Feb. 5-7, 2001, pp. 160-162.
NPL 3
Petrov, A. R., "System approach for low 1/f noise, high IP2 dynamic range CMOS mixer design," University/Government/Industry Microelectronics Symp., 2003. Proc. of the 15th Biennial, Jun. 30-Jul. 2, 2003, pp. 74-77.
NPL 4
Gang XU, et al, "Comparison of Charge Sampling and Voltage Sampling", Proc. of the 43rd IEEE Midwest Symp. on Circuits and Systems, Aug. 8-11, 2000, pp. 440-443.

SUMMARY OF INVENTION

Technical Problem

With the charge sampling circuit configuration shown in Non-Patent Literature 4, it is considered to be possible to suppress self-mixing if the duty ratio is made 25%, as in Non-Patent Literature 3. Here, there is a problem in that, although an attenuation pole obtained through a current integration effect of a charge sampling configuration can be used for suppression of harmonic response, if the duty ratio is set to a value of less than 50%, such as 25%, an attenuation pole of twice the local oscillation signal generated when the duty ratio is 50% is shifted toward a higher-order frequency with respect to the local oscillation signal, with the result that low-order harmonic response can no longer be suppressed. Thus, with a charge sampling circuit configuration, suppression of self-mixing and suppression of low-order harmonic response close to a desired frequency band cannot be achieved simultaneously.

It is an object of the present invention to provide a mixer capable of simultaneously achieving suppression of self-mixing and suppression of low-order harmonic response with a charge sampling circuit configuration.

Solution to Problem

A multiphase mixer of the present invention, firstly, has a configuration comprising: a transconductance amplifier that converts a voltage signal to a current signal; N (where N is a natural number of two or more) first integration elements connected in parallel to a subsequent stage of the transconductance amplifier; and 2N mixers connected in parallel in pairs to the respective N first integration elements; wherein two mixers connected to the same integration element of any of the N first integration elements are controlled by driving signals comprising pulse trains having the same frequency and phases differing by 180°.

By means of this configuration, suppression of mixer harmonic response can be achieved.

A multiphase mixer of the present invention, secondly, is a multiphase mixer having the first configuration, having a configuration wherein each of the driving signals controlling the 2N mixers has an on-period ratio of 100/2N (%) with respect to one cycle.

By means of this configuration, suppression of mixer self-mixing and suppression of mixer harmonic response can be achieved simultaneously.

A multiphase mixer of the present invention, thirdly, is a multiphase mixer having the first or second configuration, having a configuration wherein the 2N mixers are controlled by driving signals comprising pulse trains having the same frequency and phases differing by 180/N(°), and of the 2N mixers, N mixers controlled by driving signals comprising pulse trains whose on-periods are adjacent are connected to the same second integration element.

By means of this configuration, suppression of mixer self-mixing and suppression of mixer harmonic response can be achieved simultaneously.

A multiphase mixer of the present invention, fourthly, is a multiphase mixer having the first or second configuration, having a configuration wherein the 2N mixers are controlled by driving signals comprising pulse trains having the same frequency and phases differing by 180/N(°), and of the 2N mixers, two mixers controlled by driving signals comprising pulse trains whose on-period phase difference is 180° are connected to the same second integration element.

By means of this configuration, suppression of mixer self-mixing and suppression of mixer harmonic response can be achieved simultaneously.

A multiphase mixer of the present invention, fifthly, is a multiphase mixer having any one of the first through fourth configurations, having a configuration wherein the 2N mixers are controlled by driving signals comprising pulse trains that are not in an on state simultaneously.

By means of this configuration, suppression of mixer self-mixing and suppression of mixer harmonic response can be achieved simultaneously.

A multiphase mixer of the present invention, sixthly, is a multiphase mixer having any one of the first through fifth configurations, having a configuration wherein the N is 2.

By means of this configuration, suppression of mixer self-mixing and suppression of mixer harmonic response can be achieved simultaneously.

A multiphase mixer of the present invention, seventhly, is a multiphase mixer having any one of the first through fifth configurations, having a configuration wherein the N is 3.

By means of this configuration, suppression of mixer self-mixing and suppression of mixer harmonic response can be achieved simultaneously.

A multiphase mixer of the present invention, eighthly, has a configuration comprising: a transconductance amplifier that converts a voltage signal to a current signal; a first integration element connected in parallel to a subsequent stage of the transconductance amplifier; and M (where M is a natural number of two or more) mixers connected in parallel with respect to the first integration element, and controlled by driving signals comprising pulse trains having the same frequency and phases differing by L° (where L is a positive value less than 180); wherein a value obtained by multiplying L by M is 360, and of the M mixers, P (where P is a natural number less than M) mixers controlled by driving signals comprising pulse trains whose on-periods are adjacent are connected to the same second integration element.

By means of this configuration, suppression of mixer harmonic response can be achieved.

A multiphase mixer of the present invention, ninthly, is a multiphase mixer having the eighth configuration, having a configuration wherein each of the driving signals controlling the M mixers has an on-period ratio of 100/M (%) with respect to one cycle.

By means of this configuration, suppression of mixer self-mixing and suppression of mixer harmonic response can be achieved simultaneously.

A multiphase mixer of the present invention, tenthly, is a multiphase mixer having the eighth or ninth configuration, having a configuration wherein the M mixers are controlled by driving signals comprising pulse trains that are not in an on state simultaneously.

By means of this configuration, suppression of mixer self-mixing and suppression of mixer harmonic response can be achieved simultaneously.

A multiphase mixer of the present invention, eleventhly, is a multiphase mixer having any one of the eighth through tenth configurations, having a configuration wherein the L is 90, the M is 4, and the P is 2.

By means of this configuration, suppression of mixer self-mixing and suppression of mixer harmonic response can be achieved simultaneously.

A multiphase mixer of the present invention, twelfthly, is a multiphase mixer having any one of the eighth through tenth configurations, having a configuration wherein the L is 60, the M is 6, and the P is 3.

By means of this configuration, suppression of mixer self-mixing and suppression of mixer harmonic response can be achieved simultaneously.

A multiphase mixer of the present invention, thirteenthly, has a configuration comprising: a transconductance amplifier that converts a voltage signal to a current signal; a first integration element connected in parallel to a subsequent stage of the transconductance amplifier; and M (where M is a natural number of two or more) mixers connected in parallel with respect to the first integration element, and controlled by driving signals comprising pulse trains having the same frequency and phases differing by L° (where L is a positive value less than 180); wherein a value obtained by multiplying L by M is 360, and of the M mixers, two mixers controlled by driving signals comprising pulse trains whose on-period phase difference is 180° are connected to the same second integration element.

By means of this configuration, suppression of mixer harmonic response can be achieved.

A multiphase mixer of the present invention, fourteenthly, is a multiphase mixer having the thirteenth configuration, having a configuration wherein each of the driving signals controlling the M mixers has an on-period ratio of 100/M (%) with respect to one cycle.

By means of this configuration, suppression of mixer self-mixing and suppression of mixer harmonic response can be achieved simultaneously.

A multiphase mixer of the present invention, fifteenthly, is a multiphase mixer having the thirteenth or fourteenth configuration, having a configuration wherein the M mixers are controlled by driving signals comprising pulse trains that are not in an on state simultaneously.

By means of this configuration, suppression of mixer self-mixing and suppression of mixer harmonic response can be achieved simultaneously.

DESCRIPTION OF EMBODIMENTS

Now, embodiments of the present invention will be described in detail with reference to the accompanying drawings.

Embodiment 1

In this embodiment, a configuration is described whereby, in an orthogonal decoder configuration (4-phase mixer) that drives four charge sampling mixers using control signals with a duty of less than 50%—specifically, control signals with a duty ratio of 1/4 (25%)—an FIR filter is formed using a residual charge in a preceding stage of the charge sampling mixers, and harmonic response that is an even multiple of a local oscillation frequency is suppressed.

Figure 1:
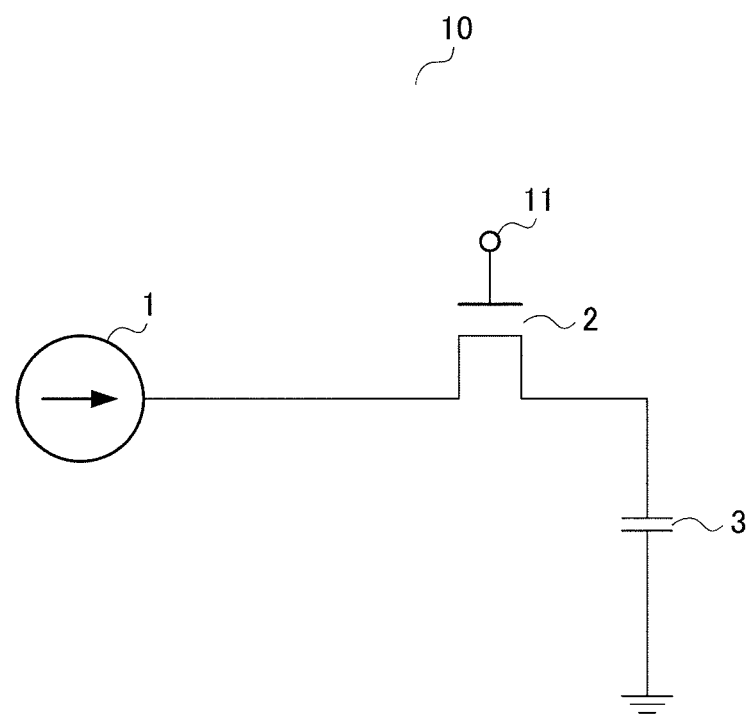
FIG. 1 is a configuration diagram of a conventional charge sampling circuit.
Figure 2:
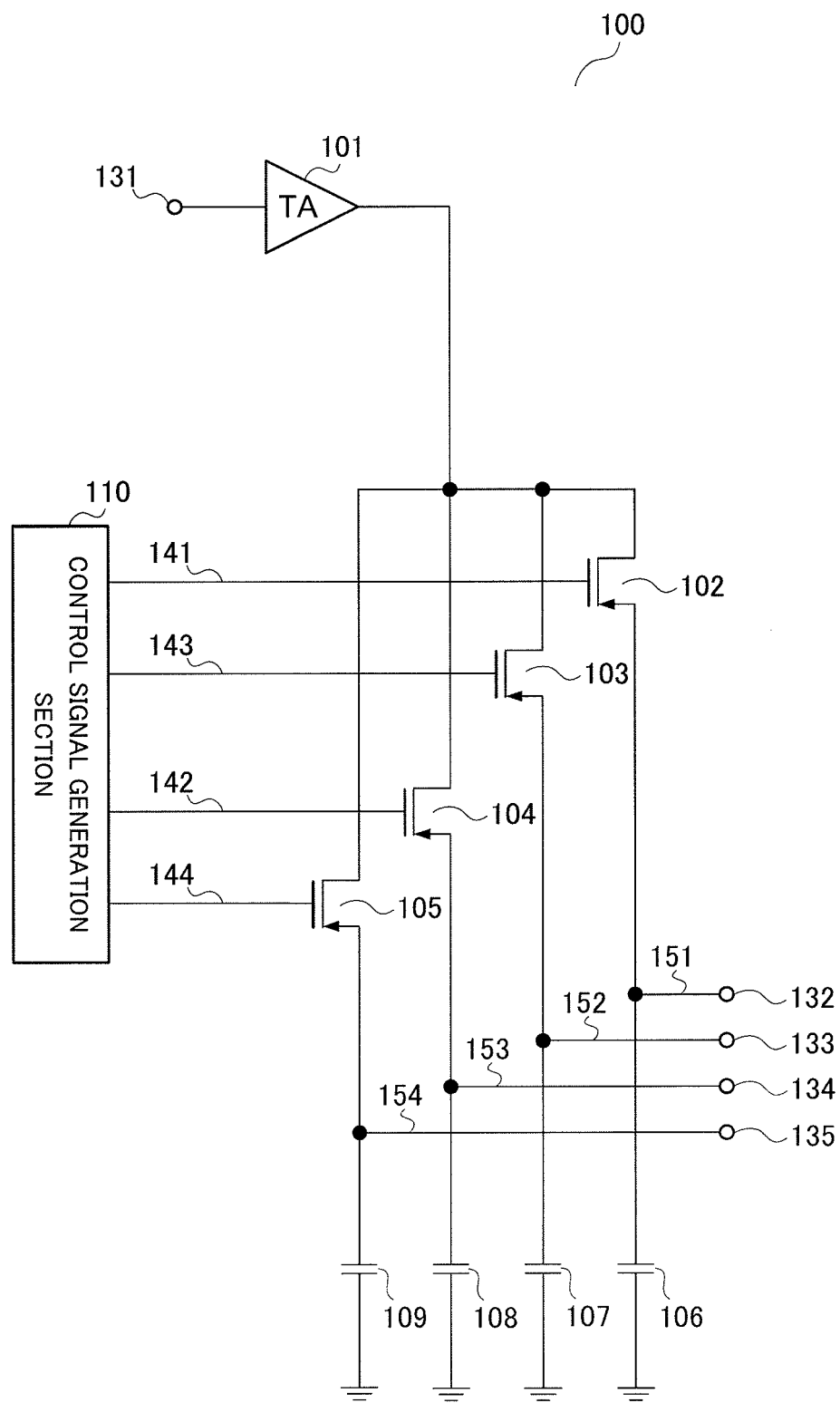
FIG. 2 shows an example of a multiphase mixer according to Embodiment 1.

FIG. 2 shows an example of the configuration of a multiphase mixer according to this embodiment. As shown in FIG. 2, multiphase mixer 100 is provided with Transconductance Amplifier (TA) 101 that converts a voltage to a current, mixer 102, mixer 103, mixer 104, mixer 105, capacitance 106, capacitance 107, capacitance 108, capacitance 109, and control signal generation section 110, performs frequency conversion of a signal input from input terminal 131, and outputs output signal 151 from output terminal 132, output signal 152 from output terminal 133, output signal 153 from output terminal 134, and output signal 154 from output terminal 135.

TA 101 converts an alternating voltage input from input terminal 131 to an alternating current. Mixer 102 is connected to TA 101, and is driven by control signal 141 output from control signal generation section 110. Mixer 103 is connected to TA 101, and is driven by control signal 143 output from control signal generation section 110. Mixer 104 is connected to TA 101, and is driven by control signal 142 output from control signal generation section 110. Mixer 105 is connected to TA 101, and is driven by control signal 144 output from control signal generation section 110. Mixer 102, mixer 103, mixer 104, and mixer 105 are driven by control signals, and charge capacitance 106, capacitance 107, capacitance 108, and capacitance 109 with an alternating current output from TA 101 only while in an active state. That is to say, a current output from TA 101 is distributed to and charges capacitance 106, capacitance 107, capacitance 108, and capacitance 109 by means of mixer 102, mixer 103, mixer 104, and mixer 105 driven by control signals. Capacitance 106, capacitance 107, capacitance 108, and capacitance 109 are loads corresponding to mixer 102, mixer 103, mixer 104, and mixer 105, respectively.

In the following description, the block comprising mixer 102, mixer 103, mixer 104, and mixer 105 is referred to as the mixer block.

Figure 3:
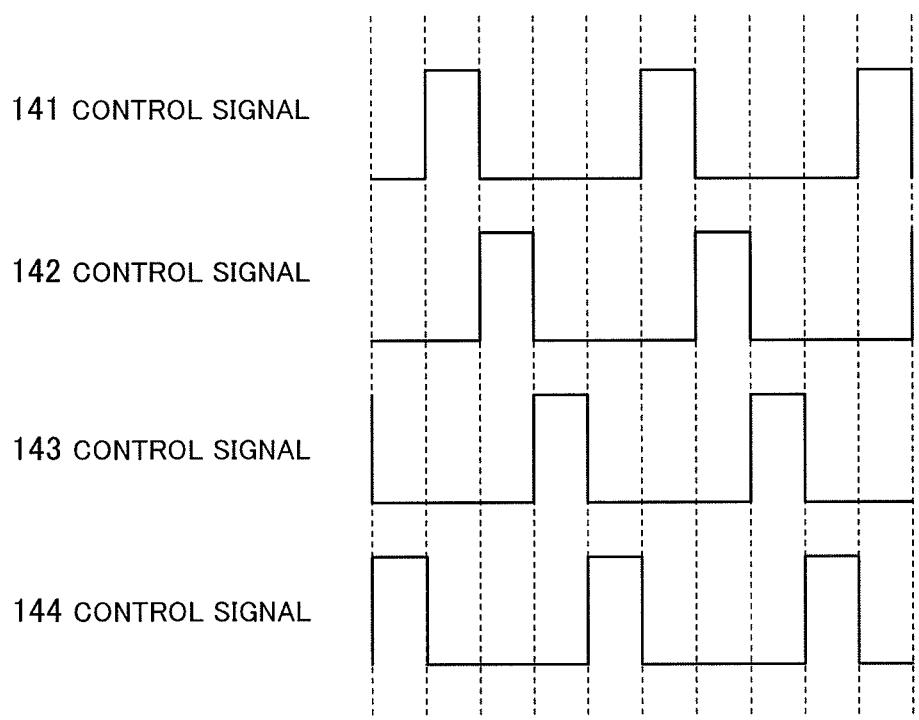
FIG. 3 shows control signal waveforms of a 4-phase mixer.

FIG. 3 shows time waveforms of control signal 141, control signal 142, control signal 143, and control signal 144. Control signal 141, control signal 142, control signal 143, and control signal 144 are rectangular waves with an identical cycle having a duty ratio of 1/4, and their waveforms should preferably be shaped so that there is no Hi interval overlapping among different control signals. Below, this waveform shaping is referred to as non-overlap waveform shaping.

As a result of driving multiphase mixer 100 using such control signals, output signal 151, output signal 152, output signal 153, and output signal 154, corresponding to an I positive phase, I negative phase, Q positive phase, and Q negative phase, are output to output terminal 132, output terminal 133, output terminal 134, and output terminal 135, respectively. Here, since the current charging time for capacitance 106, capacitance 107, capacitance 108, and capacitance 109 is 1/4 of a local oscillation signal cycle, an attenuation pole due to a current integration effect is generated at a frequency that is a constant 4 times the local oscillation signal. Also, since the multiphase mixer shown in FIG. 2 is driven only by control signals with a duty ratio of 1/4, it has an effect of suppressing self-mixing.

Figure 4:
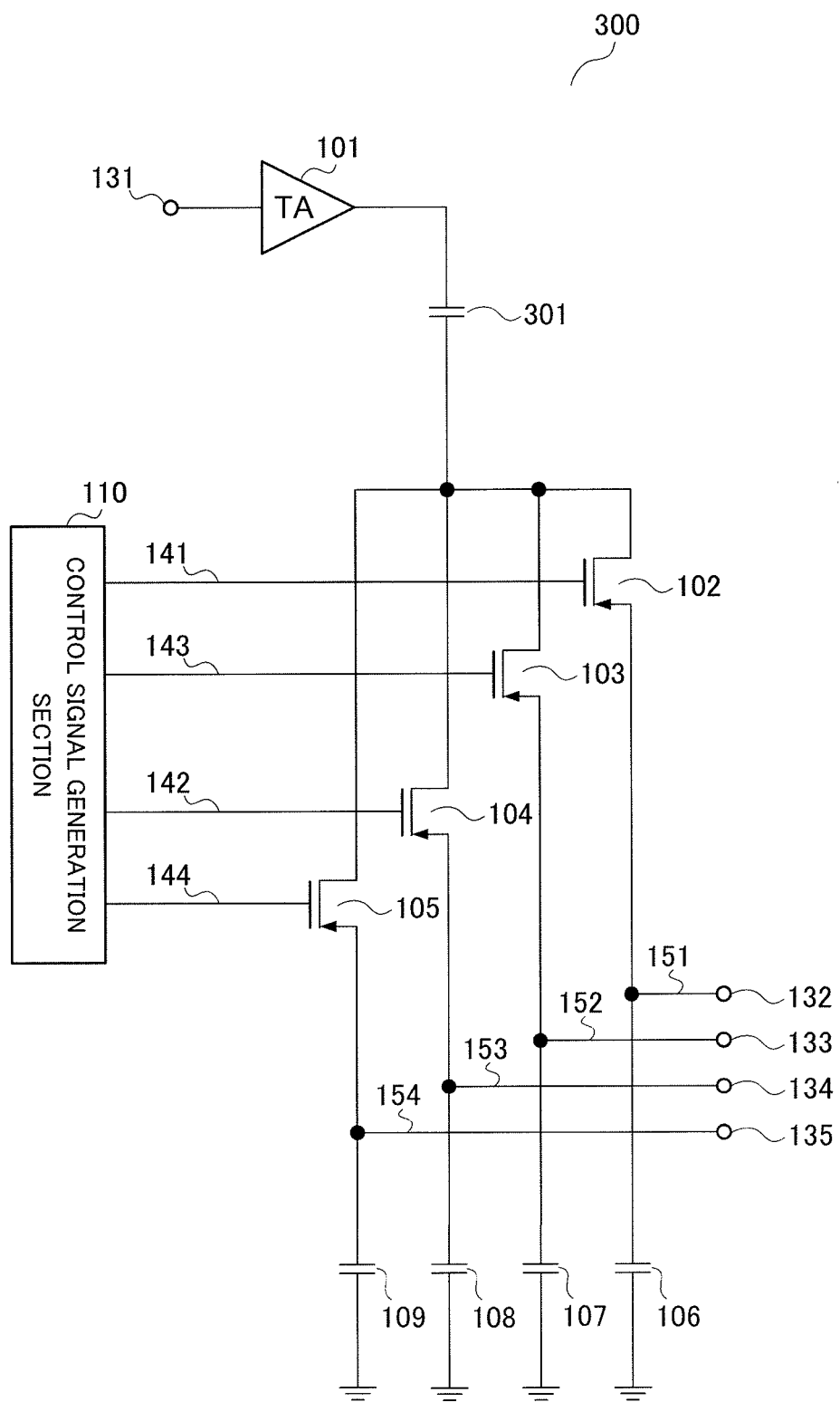
FIG. 4 shows another example of a multiphase mixer according to Embodiment 1.

The multiphase mixer shown in FIG. 2 may also have the multiphase mixer configuration shown in FIG. 4. FIG. 4 shows another example of the configuration of a multiphase mixer according to this embodiment.

Figure 5:
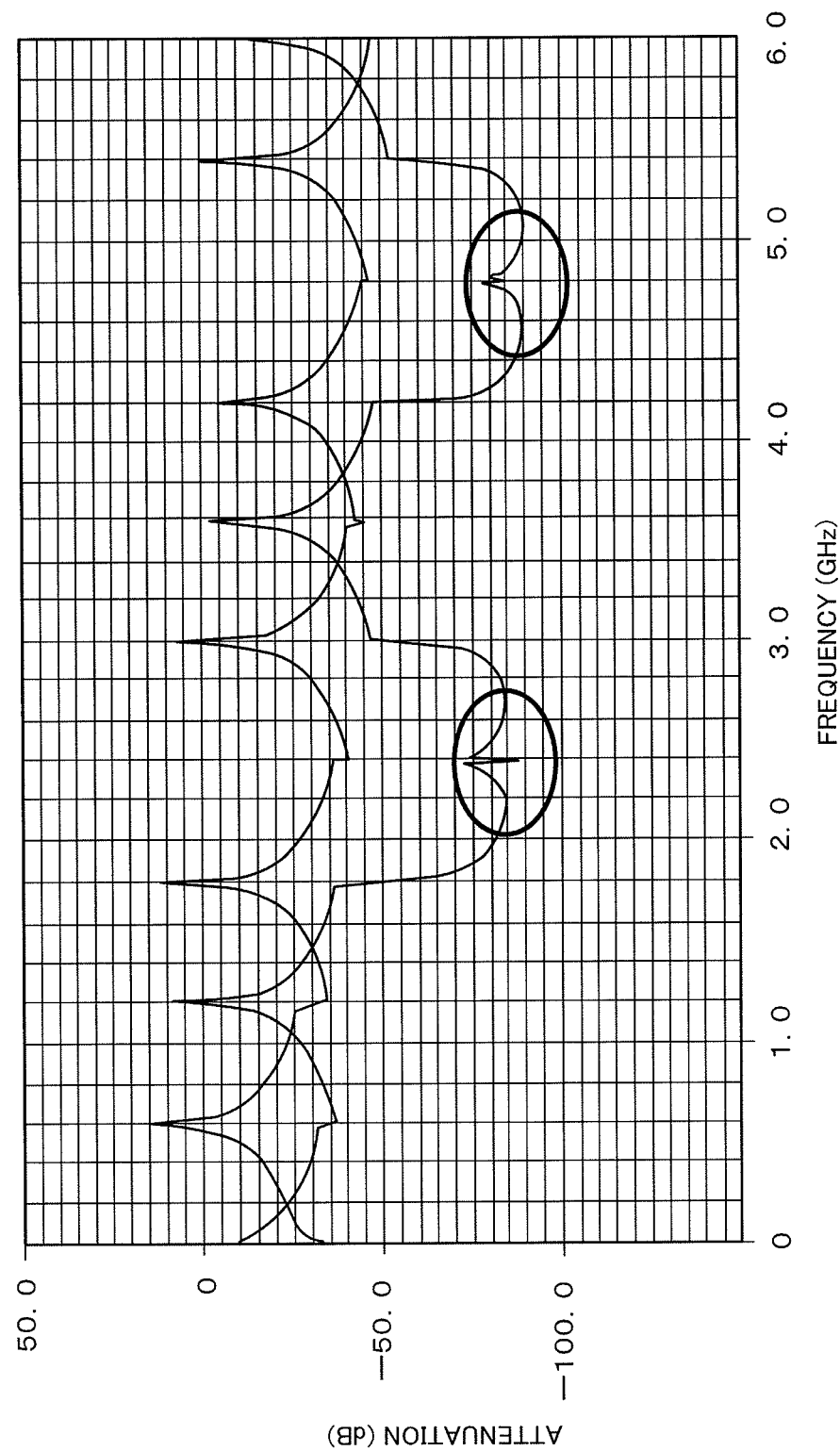
FIG. 5 shows an attenuation characteristic simulation result for the multiphase mixer in FIG. 4.

Multiphase mixer 300 in FIG. 4 differs from multiphase mixer 100 shown in FIG. 2 in having capacitance 301 connected as an integration element in series between TA 101 and the mixer block (comprising mixers 102, 103, 104, and 105). Capacitance 301 is distinct from capacitance 106, capacitance 107, capacitance 108, and capacitance 109, and below, capacitance 301 is referred to as a first integration element, and capacitance 106, capacitance 107, capacitance 108, and capacitance 109 are referred to as second integration elements. By providing capacitance 301 in series between TA 101 and the mixer block, if optimal operating points differ for TA 101 and the mixer block, this can be used to set individual operating points, or to suppress 1/f noise generated by TA 101. Other operations and functions are identical to those of multiphase mixer 100 shown in FIG. 2. That is to say, since the current charging time for capacitance 106, capacitance 107, capacitance 108, and capacitance 109 is 1/4 of the local oscillation signal cycle, an attenuation pole due to a current integration effect is generated at a frequency that is a constant 4 times the local oscillation signal, as ringed with a solid line in FIG. 5. For example, in FIG. 5, an attenuation pole due to a current integration effect is generated at a frequency of 2.4 GHz, 4 times the local oscillation signal frequency of 600 MHz. Here, FIG. 5 shows an attenuation characteristic simulation result for multiphase mixer 100 in FIG. 2 or multiphase mixer 300 in FIG. 4. Also, since the multiphase mixer shown in FIG. 4 is driven only by control signals with a duty ratio of 1/4, it has an effect of suppressing self-mixing.

A configuration will now be described, using FIG. 6, that makes it possible to generate an attenuation pole due to a current integration effect at a frequency that is an even multiple of a local oscillation signal, and to suppress self-mixing.

Figure 6:
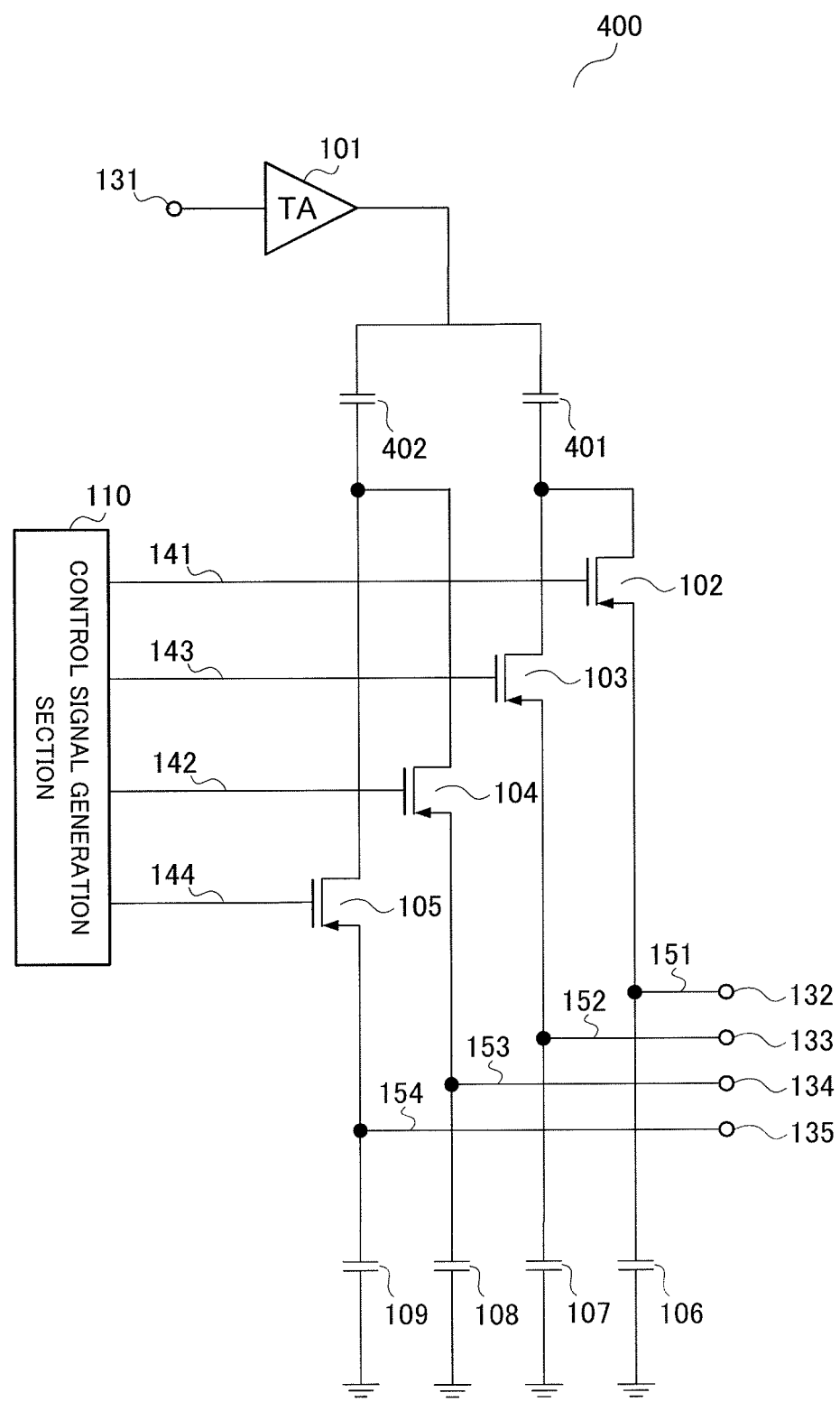
FIG. 6 shows another example of a multiphase mixer according to Embodiment 1.

FIG. 6 shows another example of the configuration of a multiphase mixer according to this embodiment. Multiphase mixer 400 in FIG. 6 differs from multiphase mixer 100 shown in FIG. 2 in having capacitance 401 connected in series between TA 101 and mixers 102 and 103, and having capacitance 402 connected in series between TA 101 and mixers 104 and 105. Capacitance 401 and capacitance 402 are distinct from capacitance 106, capacitance 107, capacitance 108, and capacitance 109, and below, capacitance 401 and capacitance 402 are referred to as first integration elements, and capacitance 106, capacitance 107, capacitance 108, and capacitance 109 are referred to as second integration elements.

When multiphase mixer 400 is mounted on a semiconductor substrate, grounding parasitic capacitances are connected to a connecting node between TA 101 and one side of capacitance 401, a connecting node between TA 101 and one side of capacitance 402, a connecting node between the other side of capacitance 401 and mixer 102 and mixer 103, and a connecting node between the other side of capacitance 402 and mixer 104 and mixer 105, respectively.

Here, for example, a period will be considered in which mixer 102 is active, and mixer 103, mixer 104, and mixer 105 are inactive. Since mixer 102 is active, charge sharing is performed between TA 101 and parasitic capacitance around mixer 102, but by using the configuration in FIG. 6, charge sharing between capacitance 106 and parasitic capacitance present at a connecting node between the other side of capacitance 401 and mixer 102 and mixer 103 becomes predominant.

Similarly, when mixer 103 is active, charge sharing between capacitance 107 and parasitic capacitance present at a connecting node between the other side of capacitance 401 and mixer 102 and mixer 103 becomes predominant, and when mixer 104 or mixer 105 is active, charge sharing between capacitance 108 or capacitance 109 and parasitic capacitance present at a connecting node between the other side of capacitance 402 and mixer 104 and mixer 105 becomes predominant.

Figure 7:
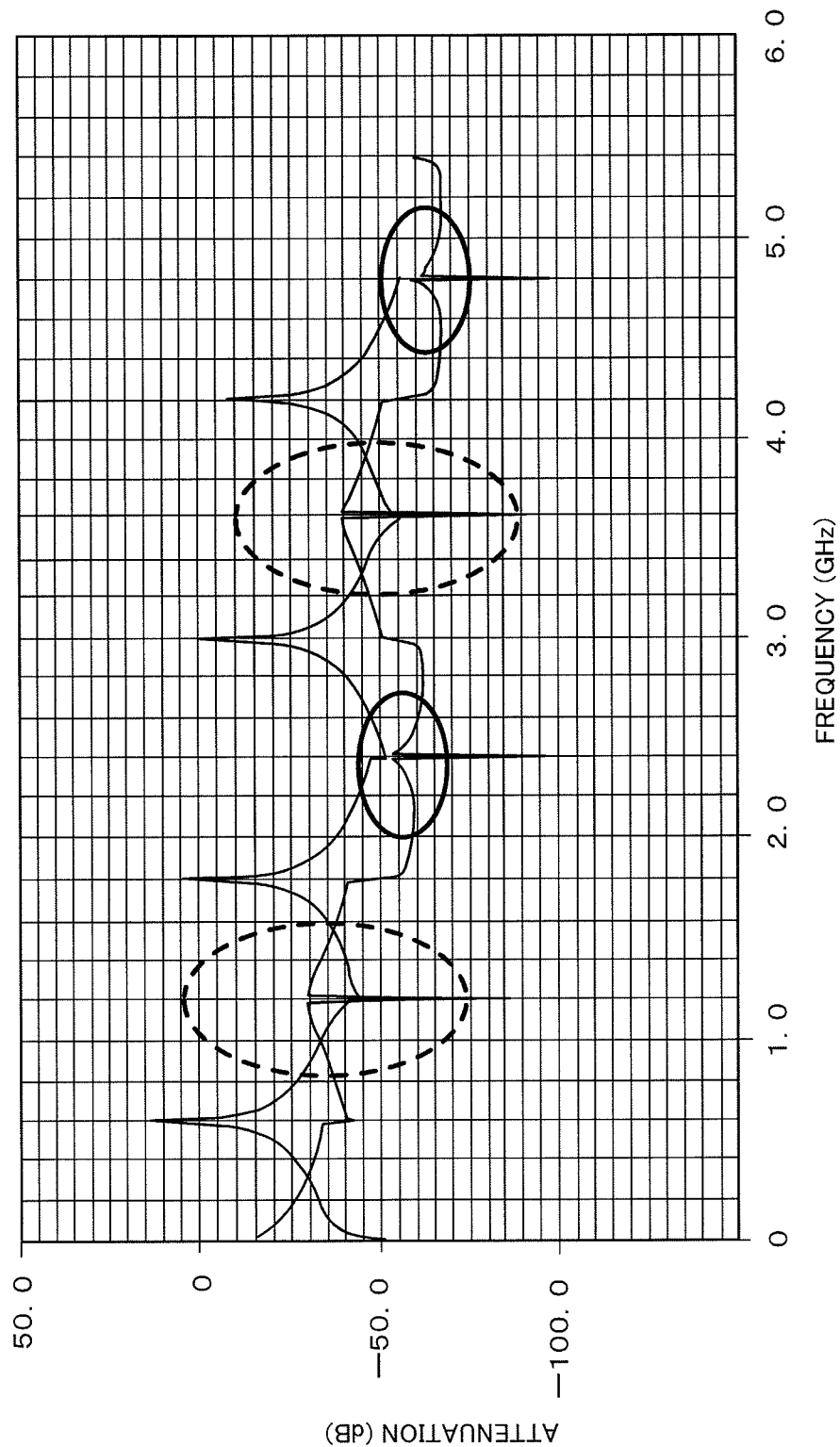
FIG. 7 shows an attenuation characteristic simulation result for the multiphase mixer in FIG. 6.

That is to say, by means of charge sharing between a load capacitance and an aforementioned predominant parasitic capacitance, an attenuation pole can be generated at a frequency that is an even multiple of the local oscillation signal apart from an attenuation pole due to a current integration effect. For example, as shown in FIG. 7, in addition to attenuation poles due to a current integration effect present in parts ringed with a solid line, an attenuation pole (a part ringed with a dotted line) is generated at a frequency that is an even multiple of the local oscillation signal. In the example shown in FIG. 7, an attenuation pole is generated at a frequency of 1.2 GHz, twice the local oscillation signal frequency of 600 MHz. Here, FIG. 7 shows an attenuation characteristic simulation result for multiphase mixer 400 in FIG. 6. Also, since multiphase mixer 400 shown in FIG. 6 is driven only by control signals with a duty ratio of 1/4, it has an effect of suppressing self-mixing.

In this embodiment, a configuration has been assumed in which a capacitive element is connected to a preceding stage of a plurality of mixers driven by a 180-degree phase difference, as in the case of multiphase mixer 400 shown in FIG. 6, with the object of generating an attenuation pole at a frequency that is an even multiple of a local oscillation signal, but if generation of an attenuation pole at a frequency that is an even multiple of a local oscillation signal is not an object, a configuration may be used in which a preceding stage of two or three mixers driven by an arbitrary phase difference is connected by a capacitance, and a filter effect due to a residual charge is arranged.

Also, in this embodiment, control signals with a duty ratio of 1/4 are used, but this is not a limitation, and control signals with a duty ratio of less than 1/4 may also be used.

Embodiment 2

In this embodiment, a configuration is described whereby, in a 6-phase mixer that drives six charge sampling mixers using control signals with a duty ratio of 1/6, an FIR filter is formed using a residual charge in a preceding stage of the charge sampling mixers, and harmonic response that is an even multiple of a local oscillation frequency is suppressed.

Figure 8:
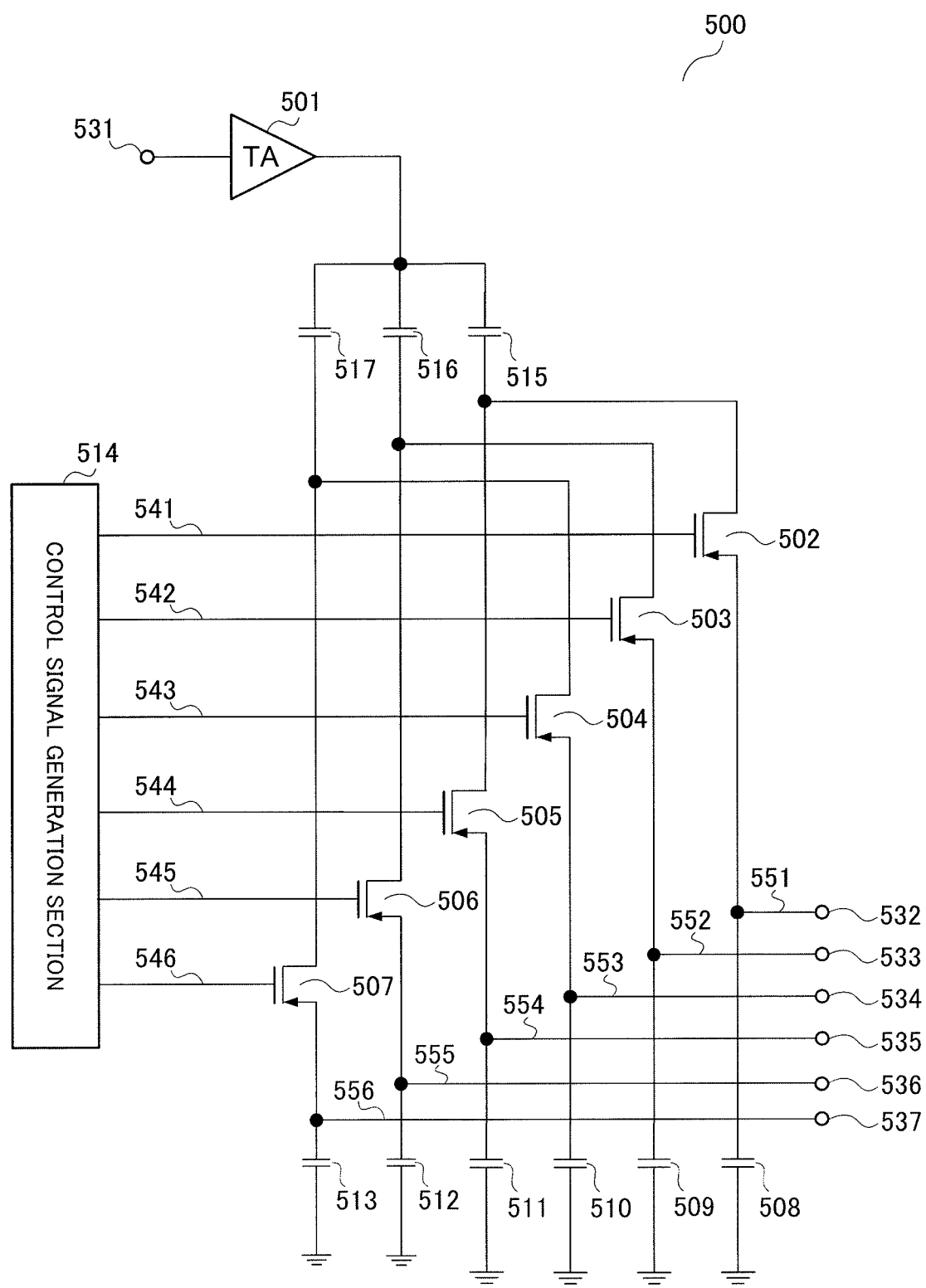
FIG. 8 shows an example of a multiphase mixer according to Embodiment 2.

FIG. 8 shows an example of the configuration of a multiphase mixer according to this embodiment. As shown in FIG. 8, multiphase mixer 500 is provided with TA 501, mixer 502, mixer 503, mixer 504, mixer 505, mixer 506, mixer 507, capacitance 508, capacitance 509, capacitance 510, capacitance 511, capacitance 512, capacitance 513, control signal generation section 514, capacitance 515, capacitance 516, and capacitance 517, performs frequency conversion of a signal input from input terminal 531, and outputs output signal 551 from output terminal 532, output signal 552 from output terminal 533, output signal 553 from output terminal 534, output signal 554 from output terminal 535, output signal 555 from output terminal 536, and output signal 556 from output terminal 537. Below, capacitance 515, capacitance 516, and capacitance 517 are referred to as first integration elements, and capacitance 508, capacitance 509, capacitance 510, capacitance 511, capacitance 512, and capacitance 512 are referred to as second integration elements.

TA 501 converts an alternating voltage input from input terminal 531 to an alternating current.

Mixer 502 is connected to TA 501, and is driven by control signal 541 output from control signal generation section 514. Mixer 503 is connected to TA 501, and is driven by control signal 542 output from control signal generation section 514. Mixer 504 is connected to TA 501, and is driven by control signal 543 output from control signal generation section 514. Mixer 505 is connected to TA 501, and is driven by control signal 544 output from control signal generation section 514. Mixer 506 is connected to TA 501, and is driven by control signal 545 output from control signal generation section 514. Mixer 507 is connected to TA 501, and is driven by control signal 546 output from control signal generation section 514.

Mixer 502, mixer 503, mixer 504, mixer 505, mixer 506, and mixer 507 are driven by control signals, and charge capacitance 508, capacitance 509, capacitance 510, capacitance 511, capacitance 512, and capacitance 513 with an alternating current output from TA 501 only while in an active state. That is to say, a current output from TA 501 is distributed to and charges capacitance 508, capacitance 509, capacitance 510, capacitance 511, capacitance 512, and capacitance 513 by means of mixer 502, mixer 503, mixer 504, mixer 505, mixer 506, and mixer 507 driven by control signals. That is to say, multiphase mixer 500 shown in FIG. 8 is an extension of multiphase mixer 400 shown in FIG. 6 from a 4-phase configuration to a 6-phase configuration.

Capacitance 508, capacitance 509, capacitance 510, capacitance 511, capacitance 512, and capacitance 513 are loads corresponding to mixer 502, mixer 503, mixer 504, mixer 505, mixer 506, and mixer 507, respectively.

Capacitance 515 is a capacitance for performing capacitative coupling between TA 501 and mixer 502 and mixer 505. Capacitance 516 is a capacitance for performing capacitative coupling between TA 501 and mixer 503 and mixer 506. Capacitance 517 is a capacitance for performing capacitative coupling between TA 501 and mixer 504 and mixer 507.

Figure 9:
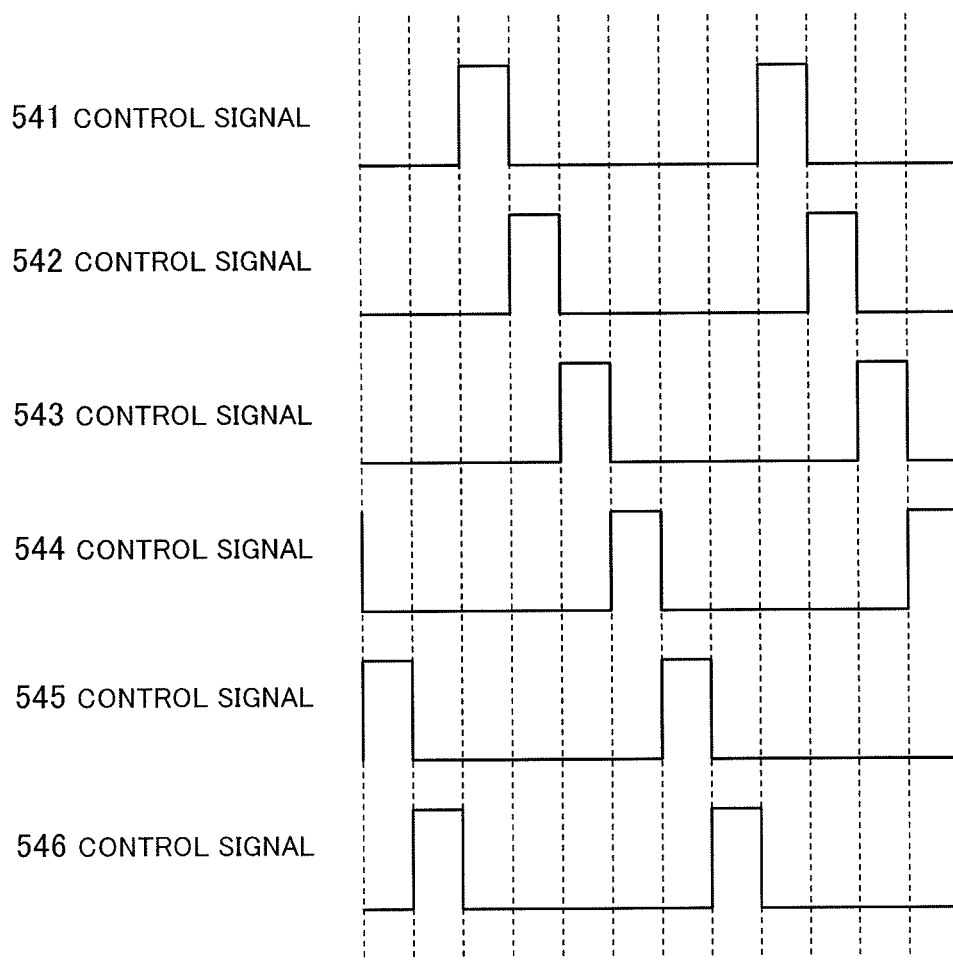
FIG. 9 shows control signal waveforms of a 6-phase mixer.

FIG. 9 shows time waveforms of control signal 541, control signal 542, control signal 543, control signal 544, control signal 545, and control signal 546. Control signal 541, control signal 542, control signal 543, control signal 544, control signal 545, and control signal 546 are rectangular waves with an identical cycle having a duty ratio of 1/6, and non-overlap waveform shaping should preferably be performed on these control signals.

As a result of driving multiphase mixer 500 using such control signals, output signal 551, output signal 552, output signal 553, output signal 554, output signal 555, and output signal 556, having a 60-degree phase difference relationship in a post-frequency-conversion baseband, are output to output terminal 532, output terminal 533, output terminal 534, output terminal 535, output terminal 536, and output terminal 537, respectively.

Figure 10:
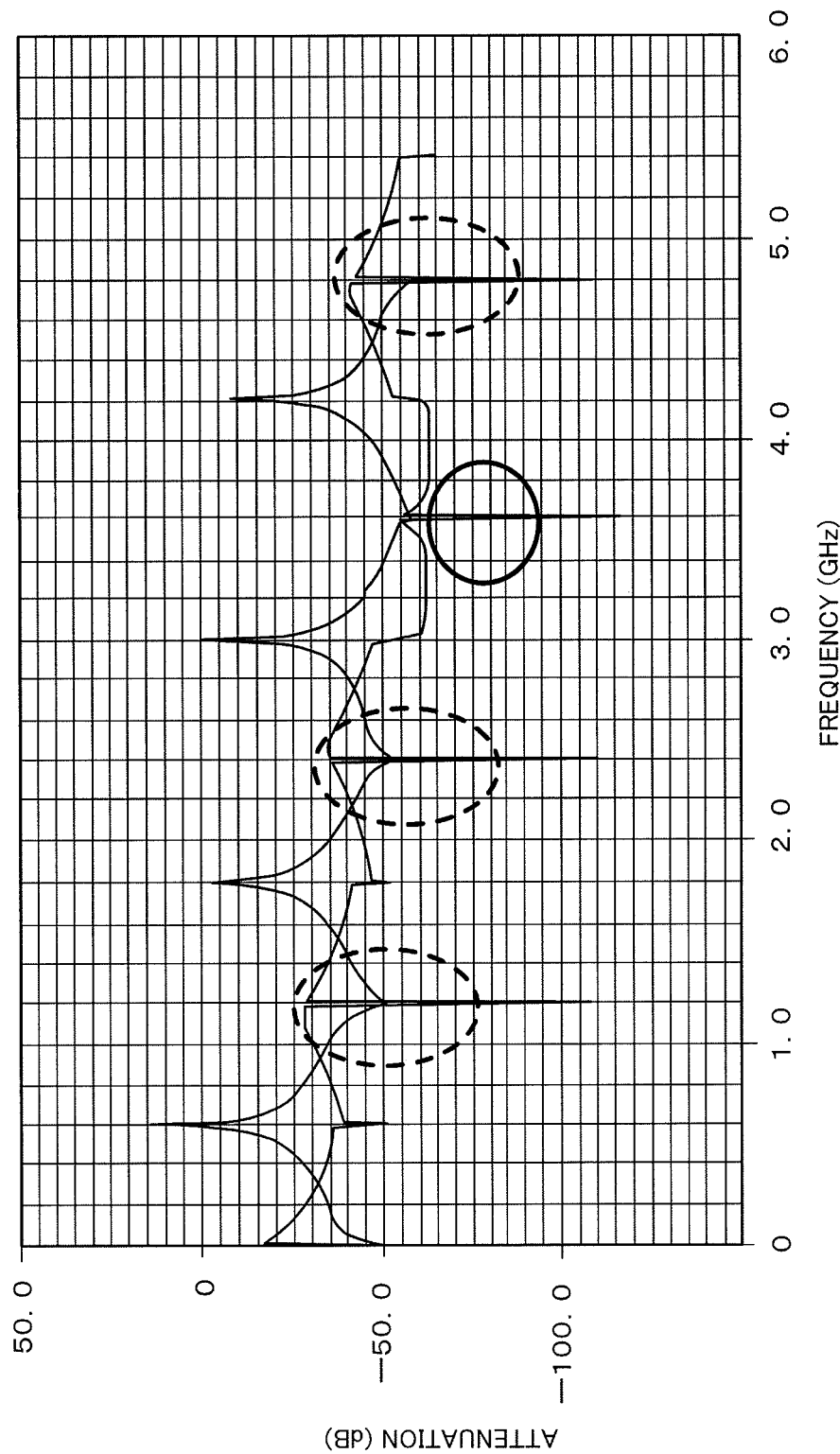
FIG. 10 shows an attenuation characteristic simulation result for the multiphase mixer in FIG. 8.

Here, since the current charging time for capacitance 508, capacitance 509, capacitance 510, capacitance 511, capacitance 512, and capacitance 513 is 1/6 of a local oscillation signal cycle, an attenuation pole due to a current integration effect is generated at a frequency that is a constant 6 times the local oscillation signal. For example, an attenuation pole due to a current integration effect is generated at a frequency of 3.6 GHz, 6 times the local oscillation signal frequency of 600 MHz, as ringed with a solid line in FIG. 10. Here, FIG. 10 shows an attenuation characteristic simulation result for multiphase mixer 500 in FIG. 8.

Capacitance 515, capacitance 516, and capacitance 517, which are first integration elements, selectively use a charge accumulated in a parasitic capacitance that performs charge sharing with a load capacitance while a mixer is activated by coupling mixers driven by control signals with a 180-degree phase difference on one side of a capacitance from among mixers driven by control signals with different phases. That is to say, as described in Embodiment 1, an attenuation pole can be generated at a frequency that is an even multiple of the local oscillation signal apart from an attenuation pole due to a current integration effect. For example, as shown in FIG. 10, in addition to an attenuation pole due to a current integration effect present in a part ringed with a solid line, an attenuation pole (a part ringed with a dotted line) is generated at a frequency that is an even multiple of the local oscillation signal. In the example shown in FIG. 10, an attenuation pole is generated at a frequency of 1.2 GHz, twice the local oscillation signal frequency of 600 MHz. Also, since the multiphase mixer shown in FIG. 8 is driven only by control signals with a duty ratio of 1/6, it has an effect of suppressing self-mixing.

In this embodiment, a configuration has been assumed in which a capacitative element is connected to a preceding stage of a plurality of mixers driven by a 180-degree phase difference, as in the case of multiphase mixer 500 shown in FIG. 8, with the object of generating an attenuation pole at a frequency that is an even multiple of a local oscillation signal, but if generation of an attenuation pole at a frequency that is an even multiple of a local oscillation signal is not an object, a configuration may be used in which a preceding stage of a plurality of mixers driven by an arbitrary phase difference is connected by a capacitance, and a filter effect due to a residual charge is arranged.

Also, in this embodiment, control signals with a duty ratio of 1/6 are used, but this is not a limitation, and control signals with a duty ratio of less than 1/6 may also be used.

Here, a 4-phase mixer configuration has been described in Embodiment 1, and a 6-phase mixer configuration in this embodiment, but an attenuation pole can be generated at a frequency that is an even multiple of the local oscillation signal, apart from an attenuation pole due to a current integration effect, by coupling preceding stages of mixers activated by a 180-degree phase difference, by a capacitance functioning as a first integration element, in an even-numbered-phase mixer configuration.

Embodiment 3

In this embodiment, a configuration is described whereby, in a 4-phase mixer driven using control signals with a duty ratio of less than 50%—specifically, control signals with a duty ratio of 1/4—harmonic response that is an even multiple of a local oscillation frequency is suppressed by charging the same load capacitance with outputs of mixers activated by adjacent phase differences.

Figure 11:
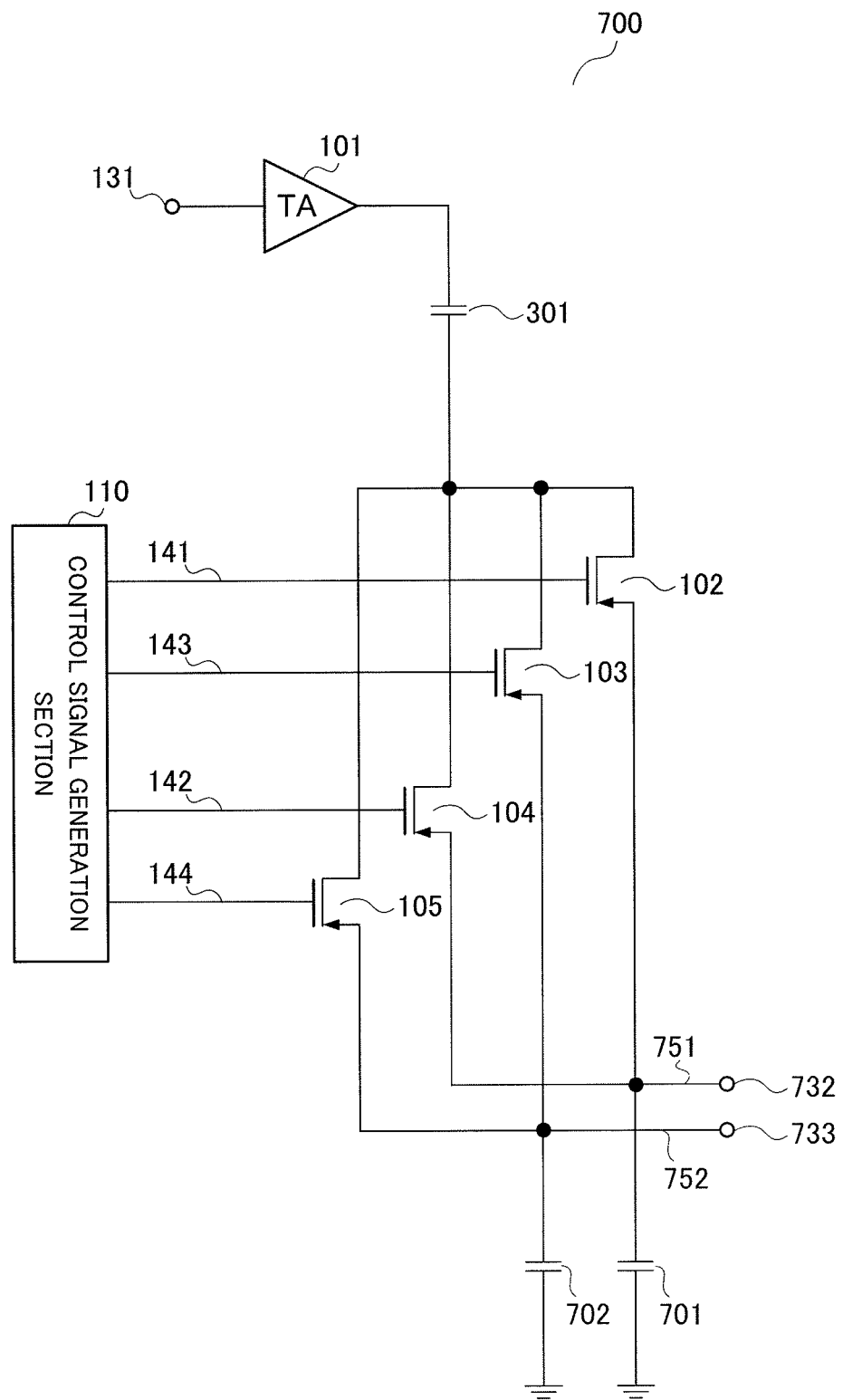
FIG. 11 shows an example of a multiphase mixer according to Embodiment 3.

FIG. 11 shows an example of the configuration of a multiphase mixer according to this embodiment. As shown in FIG. 11, multiphase mixer 700 is provided with TA 101, mixer 102, mixer 103, mixer 104, and mixer 105, capacitance 301, capacitance 701, capacitance 702, and control signal generation section 110, performs frequency conversion of a signal input from input terminal 131, and outputs output signal 751 from output terminal 732, and output signal 752 from output terminal 733. Below, capacitance 301 is referred to as a first integration element, and capacitance 701 and capacitance 702 are referred to as second integration elements.

Here, the operation and function of configuration elements assigned the same reference numbers as in FIG. 2 of Embodiment 1 or FIG. 4 of Embodiment 2 are identical to those in FIG. 2 or FIG. 4, and descriptions thereof are omitted.

In the following description, the block comprising mixer 102, mixer 103, mixer 104, and mixer 105 is referred to as the mixer block. Here, capacitance 701 is a load corresponding to mixer 102 and mixer 104, and capacitance 702 is a load corresponding to mixer 103 and mixer 104.

As a result of driving multiphase mixer 700 using the control signals shown in FIG. 3, output signal 751 and output signal 752 having a 180-degree phase difference relationship in a post-frequency-conversion baseband are output to output terminal 732 and output terminal 733, respectively.

At this time, mixer 102 and mixer 104 connected to capacitance 701 are controlled by driving signals comprising pulse trains with adjacent on-periods. Also, mixer 103 and mixer 105 connected to capacitance 702 are controlled by driving signals comprising pulse trains with adjacent on-periods.

Although it is desirable for non-overlap waveform shaping to be performed for control signal 141 and control signal 144, and control signal 142 and control signal 143, it is not absolutely necessary for non-overlap waveform shaping to be performed for control signal 141 and control signal 142, and control signal 143 and control signal 144.

Figure 12:
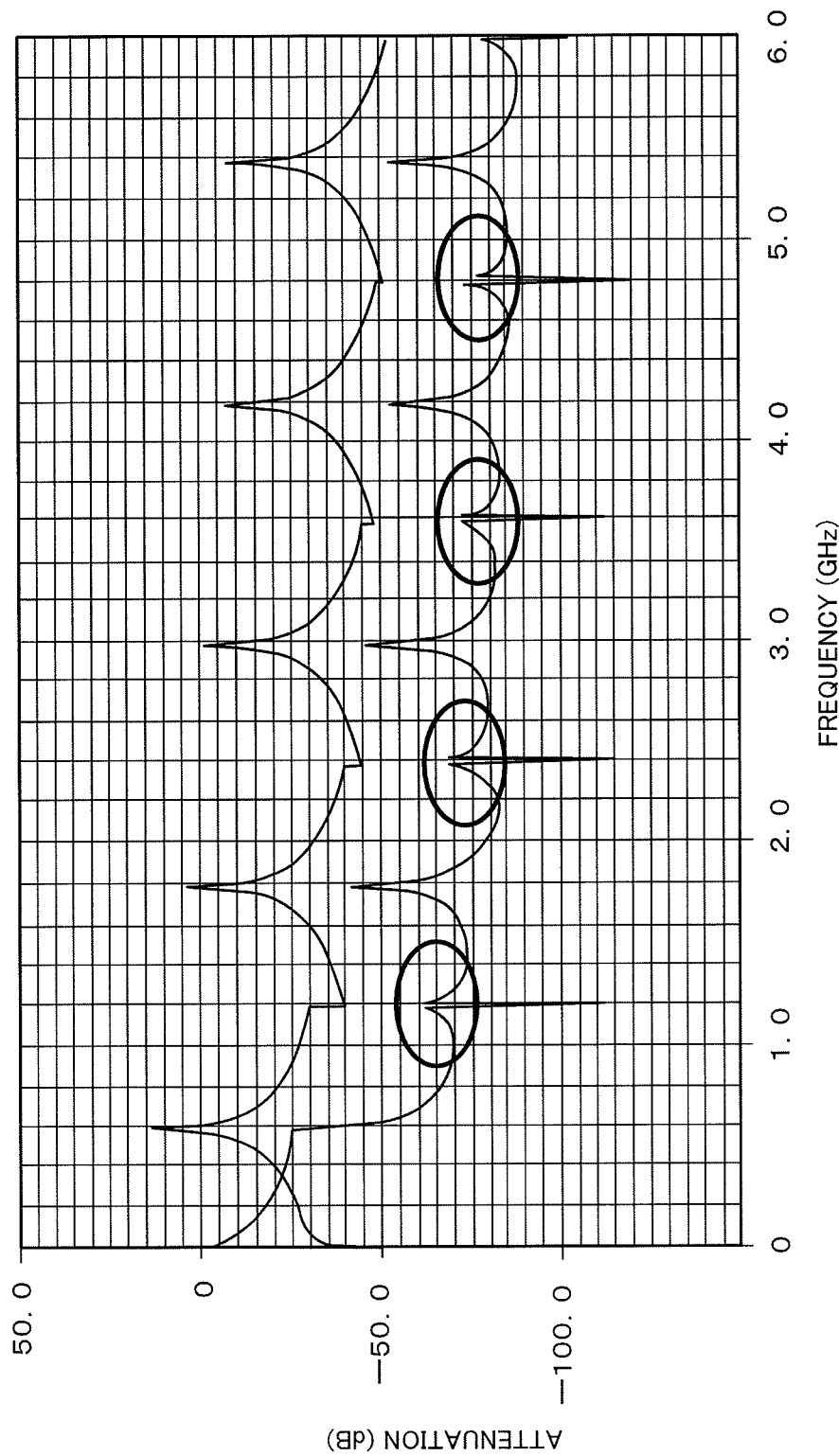
FIG. 12 shows an attenuation characteristic simulation result for the multiphase mixer in FIG. 11.

By means of this kind of configuration, charging is performed successively via mixers driven by adjacent control signals, and therefore the current charging time for capacitance 701 and capacitance 702 is ½ of a local oscillation signal cycle, and an attenuation pole due to a current integration effect is generated at a frequency that is an even multiple of the local oscillation signal frequency. For example, in FIG. 12, an attenuation pole due to a current integration effect is generated at a frequency of 1.2 GHz, twice the local oscillation signal frequency of 600 MHz. Here, FIG. 12 shows an attenuation characteristic simulation result for multiphase mixer 700 in FIG. 11. Also, since the multiphase mixer shown in FIG. 11 is driven only by control signals with a duty ratio of 1/4, it has an effect of suppressing self-mixing.

In this embodiment, control signals with a duty ratio of 1/4 are used, but this is not a limitation, and control signals with a duty ratio of less than 1/4 may also be used.

Also, in this embodiment, if optimal operating points differ for TA 101 and the mixer block, capacitance 301 is used to set individual operating points, or to suppress 1/f noise generated by TA 101, but this is not a limitation, and capacitance 301 may be eliminated, and TA 101 and the mixer block may be connected without the intermediation of a capacitance.

Embodiment 4

In this embodiment, a configuration is described whereby, in a 6-phase mixer driven using control signals with a duty ratio of less than 50%—specifically, control signals with a duty ratio of 1/6—harmonic response that is an even multiple of a local oscillation frequency is suppressed by charging the same load capacitance with outputs of mixers activated by adjacent phase differences. That is to say, a configuration is shown in which 4-phase mixer 700 shown in Embodiment 3 is extended to a 6-phase mixer.

Figure 13:
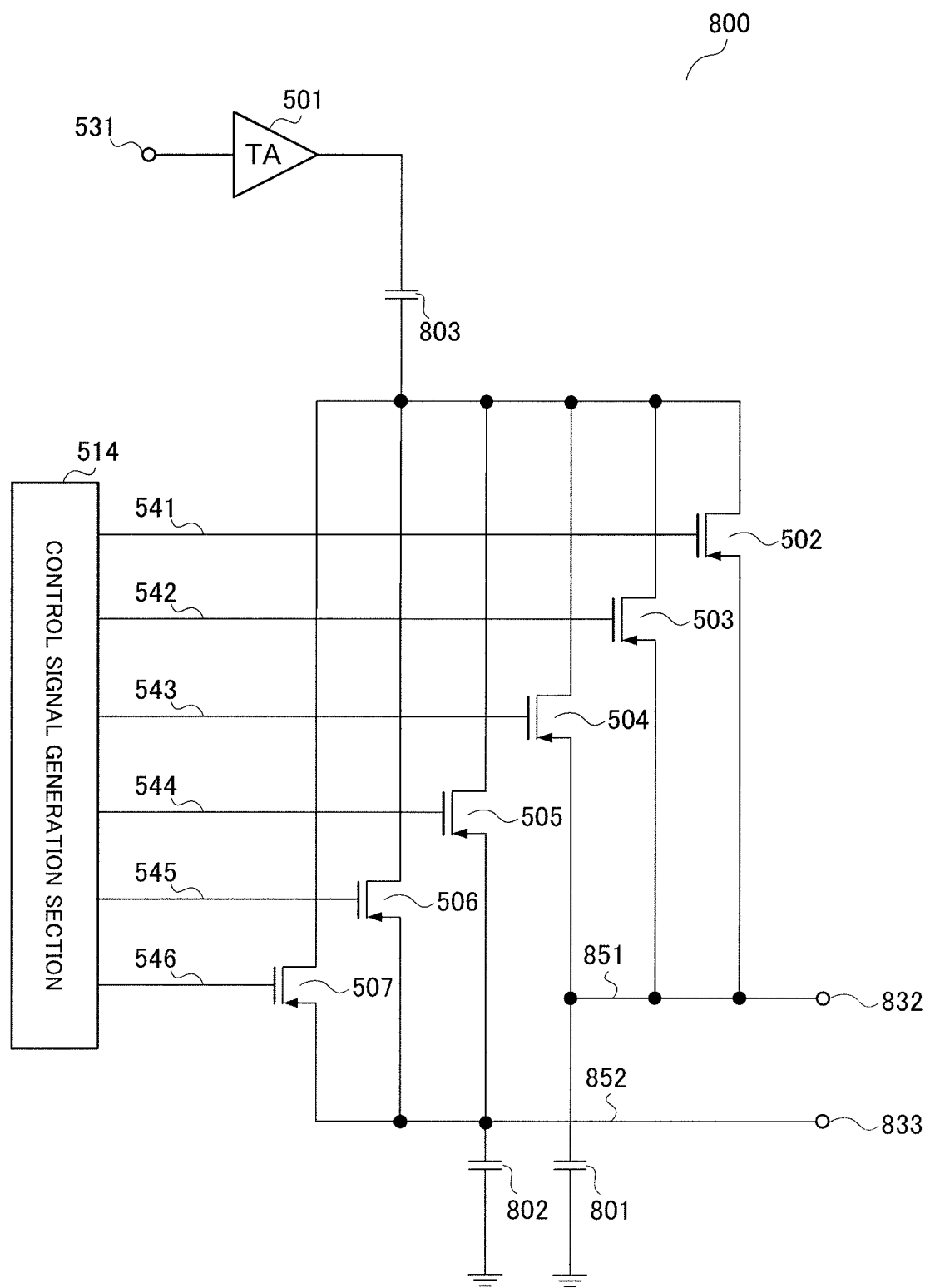
FIG. 13 shows an example of a multiphase mixer according to Embodiment 4.

FIG. 13 shows an example of the configuration of a multiphase mixer according to this embodiment. As shown in FIG. 13, multiphase mixer 800 is provided with TA 501, mixer 502, mixer 503, mixer 504, mixer 505, mixer 506, mixer 507, capacitance 801, capacitance 802, control signal generation section 514, and capacitance 803, performs frequency conversion of a signal input from input terminal 531, and outputs output signal 851 from output terminal 832, and output signal 852 from output terminal 833. Here, the operation and function of configuration elements assigned the same reference numbers as in FIG. 8 of Embodiment 2 are identical to those in FIG. 8, and descriptions thereof are omitted.

Also, in the following description, the block comprising mixer 502, mixer 503, mixer 504, mixer 505, mixer 506, and mixer 507 is referred to as the mixer block.

Capacitance 801 is a load corresponding to mixer 502, mixer 503, and mixer 504, and capacitance 802 is a load corresponding to mixer 505, mixer 506, and mixer 507. Capacitance 803 is a capacitive coupling capacitance that is connected in series between TA 501 and the mixer block, and is used for operating point optimization for the various circuits, or to suppress 1/f noise generated by TA 501.

As a result of driving multiphase mixer 800 using the control signals shown in FIG. 9, output signal 851 and output signal 852 having a 180-degree phase difference relationship in a post-frequency-conversion baseband are output to output terminal 832 and output terminal 833, respectively.

Although it is desirable for non-overlap waveform shaping to be performed for control signal 541 and control signal 546, and control signal 543 and control signal 544, it is not absolutely necessary for non-overlap waveform shaping to be performed for other adjacent control signals.

Figure 14:
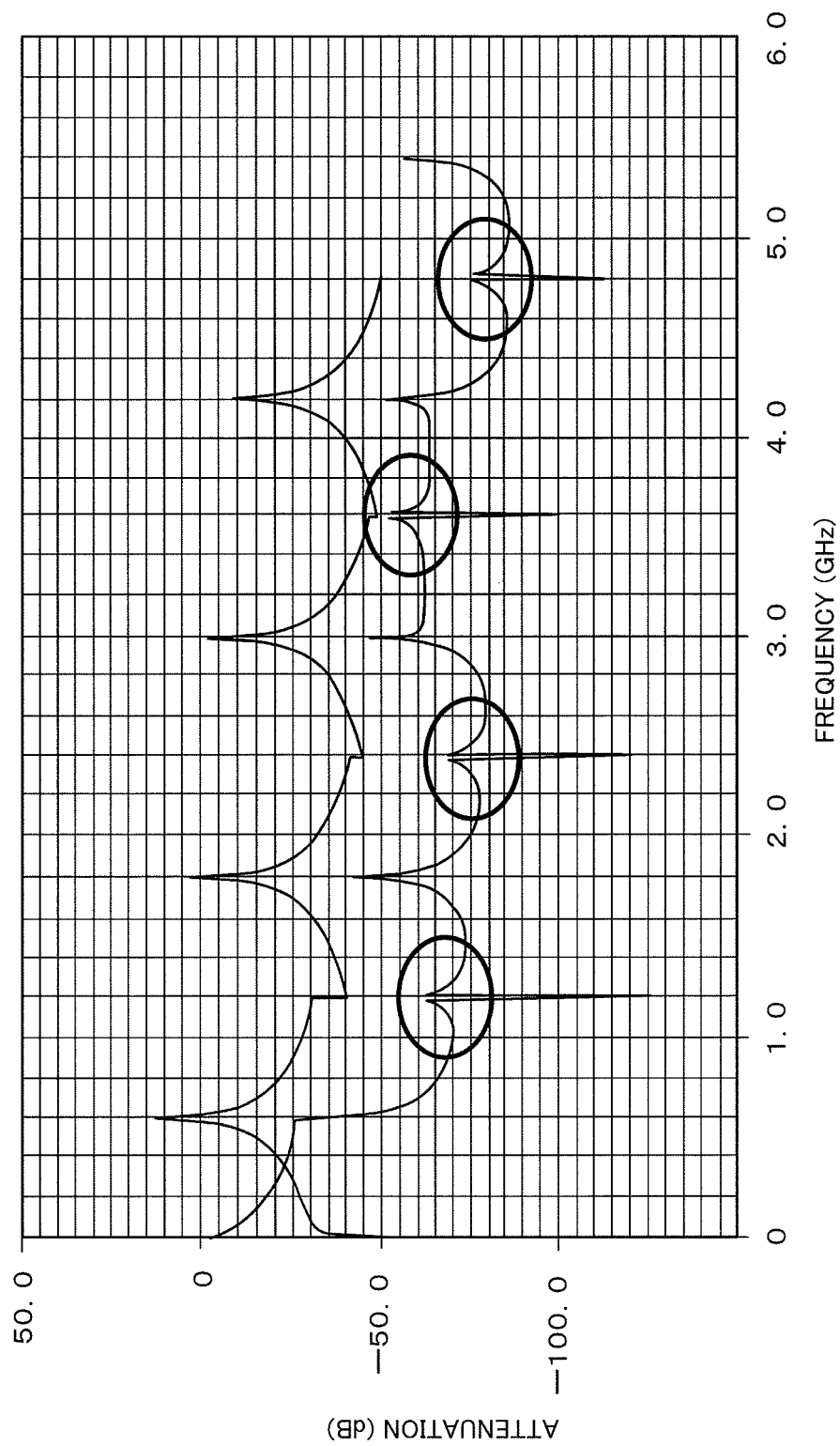
FIG. 14 shows an attenuation characteristic simulation result for the multiphase mixer in FIG. 13.

By means of this kind of configuration, charging is performed successively via mixers driven by adjacent control signals, and therefore the current charging time for capacitance 801 and capacitance 802 is ½ of a local oscillation signal cycle, and an attenuation pole due to a current integration effect is generated at a frequency that is an even multiple of the local oscillation signal frequency. For example, an attenuation pole due to a current integration effect is generated at a frequency that is an even multiple of the local oscillation signal frequency, as ringed with a solid line in FIG. 14. For example, in FIG. 14, an attenuation pole due to a current integration effect is generated at a frequency of 1.2 GHz, twice the local oscillation signal frequency of 600 MHz. Here, FIG. 14 shows an attenuation characteristic simulation result for multiphase mixer 800 in FIG. 13. Also, since the multiphase mixer shown in FIG. 13 is driven only by control signals with a duty ratio of 1/6, it has an effect of suppressing self-mixing.

In this embodiment, control signals with a duty ratio of 1/6 are used, but this is not a limitation, and control signals with a duty ratio of less than 1/6 may also be used.

Also, in this embodiment, capacitance 803 is used to perform capacitive coupling between TA 501 and the mixer block, but this is not a limitation, and capacitance 803 may be eliminated, and TA 501 and the mixer block may be connected without the intermediation of a capacitance.

Embodiment 5

In this embodiment, a configuration is described whereby, in a 6-phase mixer driven using control signals with a duty ratio of less than 50%—specifically, control signals with a duty ratio of 1/6—harmonic response that is an integer 3 multiple of a local oscillation frequency is suppressed by charging the same load capacitance with outputs of mixers activated by a 180-degree phase difference.

Figure 15:
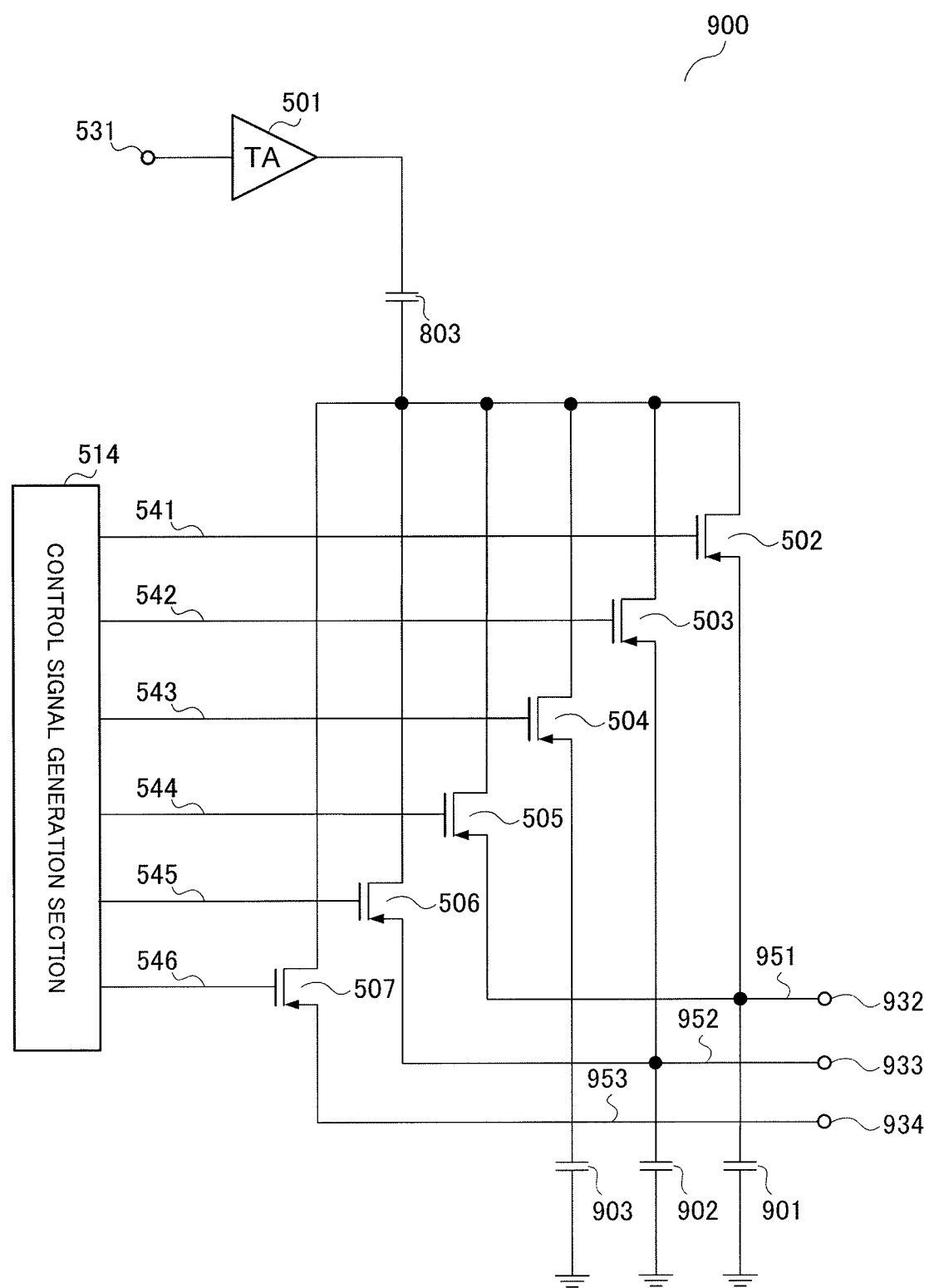
FIG. 15 shows an example of a multiphase mixer according to Embodiment 5.

FIG. 15 shows an example of the configuration of a multiphase mixer according to this embodiment. As shown in FIG. 15, multiphase mixer 900 is provided with TA 501, mixer 502, mixer 503, mixer 504, mixer 505, mixer 506, mixer 507, capacitance 901, capacitance 902, capacitance 903, control signal generation section 514, and capacitance 803, performs frequency conversion of a signal input from input terminal 531, and outputs output signal 951 from output terminal 932, output signal 952 from output terminal 933, and output signal 953 from output terminal 934. Here, the operation and function of configuration elements assigned the same reference numbers as in FIG. 13 of Embodiment 4 are identical to those in FIG. 13, and descriptions thereof are omitted.

Also, in the following description, the block comprising mixer 502, mixer 503, mixer 504, mixer 505, mixer 506, and mixer 507 is referred to as the mixer block.

Capacitance 901 is a load corresponding to mixer 502 and mixer 505, capacitance 902 is a load corresponding to mixer 503 and mixer 506, and capacitance 903 is a load corresponding to mixer 504 and mixer 507.

Figure 16:
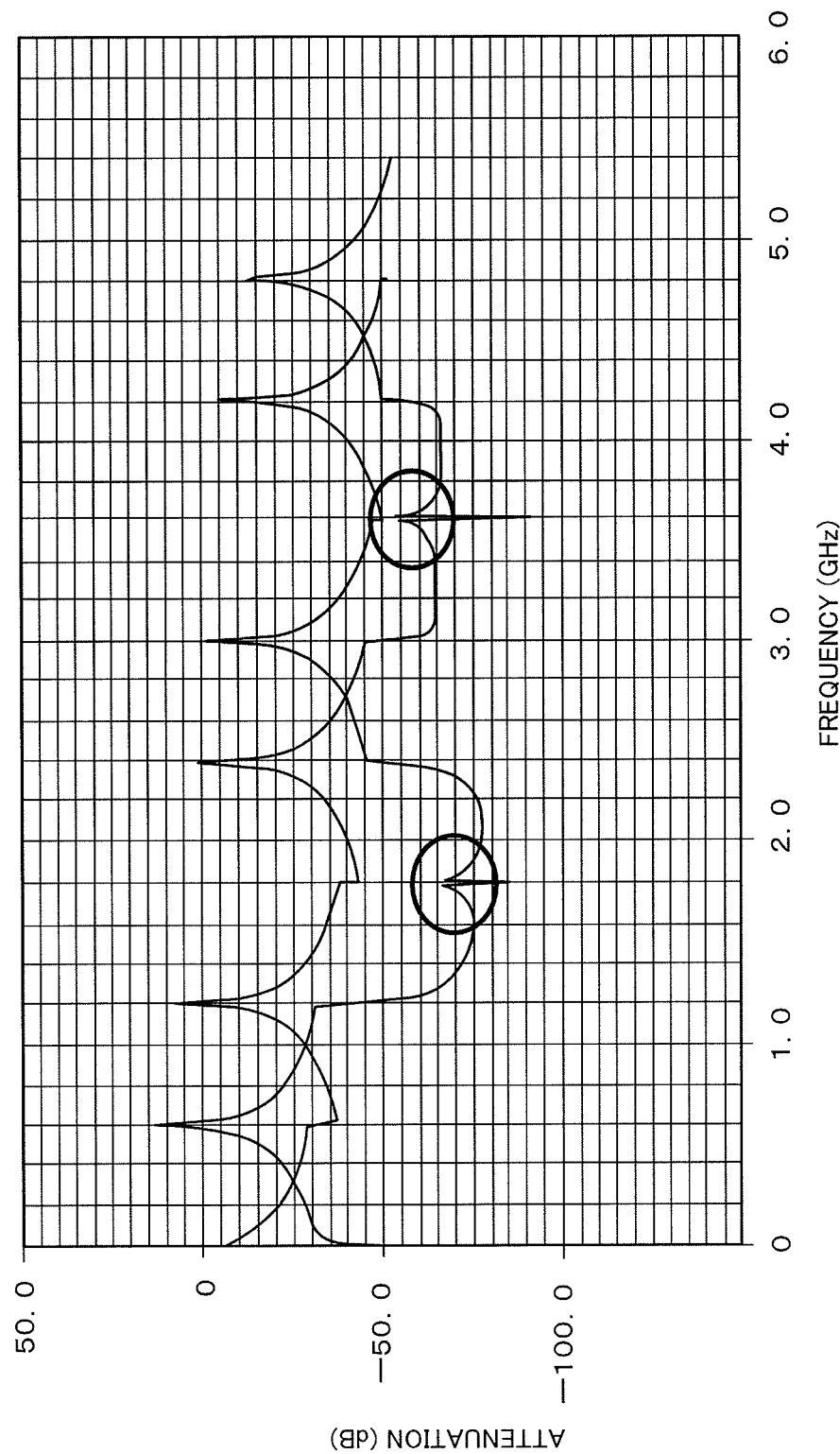
FIG. 16 shows an attenuation characteristic simulation result for the multiphase mixer in FIG. 15.

Here, it is desirable for inter-control-signal non-overlap waveform shaping to be performed for the control signals shown in FIG. 9. By means of this kind of configuration, current charging is performed via mixers. The charging time is ⅓ of a local oscillation signal cycle, and an attenuation pole due to a current integration effect is generated at a frequency that is an even multiple of the local oscillation signal frequency. For example, an attenuation pole due to a current integration effect is generated at a frequency that is a constant 3 multiple of the local oscillation signal frequency, as ringed with a solid line in FIG. 16. For example, in FIG. 16, an attenuation pole due to a current integration effect is generated at a frequency of 1.8 GHz, three times the local oscillation signal frequency of 600 MHz. Here, FIG. 16 shows an attenuation characteristic simulation result for multiphase mixer 900 in FIG. 15. Also, since the multiphase mixer shown in FIG. 15 is driven only by control signals with a duty ratio of 1/6, it has an effect of suppressing self-mixing.

In this embodiment, control signals with a duty ratio of 1/6 are used, but this is not a limitation, and control signals with a duty ratio of less than 1/6 may also be used.

Also, in this embodiment, capacitance 803 is used to perform capacitive coupling between TA 501 and the mixer block, but this is not a limitation, and capacitance 803 may be eliminated, and TA 501 and the mixer block may be connected without the intermediation of a capacitance.

Furthermore, in Embodiment 4, a configuration is used in which the outputs of three mixers driven by 60-degree phase differences are connected, as in multiphase mixer 800 shown in FIG. 13, with the object of generating an attenuation pole at a frequency that is an even multiple of a local oscillation signal. In contrast, in this embodiment, a configuration is used in which the outputs of two mixers driven by a 180-degree phase difference are connected, as in multiphase mixer 900 shown in FIG. 15, with the object of generating an attenuation pole at a frequency that is a constant 3 multiple of a local oscillation signal. However, if generation of an attenuation pole at a frequency that is an even multiple, or a constant 3 multiple, of a local oscillation signal is not an object, for instance, a configuration may be used whereby load capacitance charging is performed with the outputs of a plurality of mixers driven by arbitrary phase differences connected.

Embodiment 6

This embodiment is a combination of Embodiment 2 and Embodiment 4.

Figure 17:
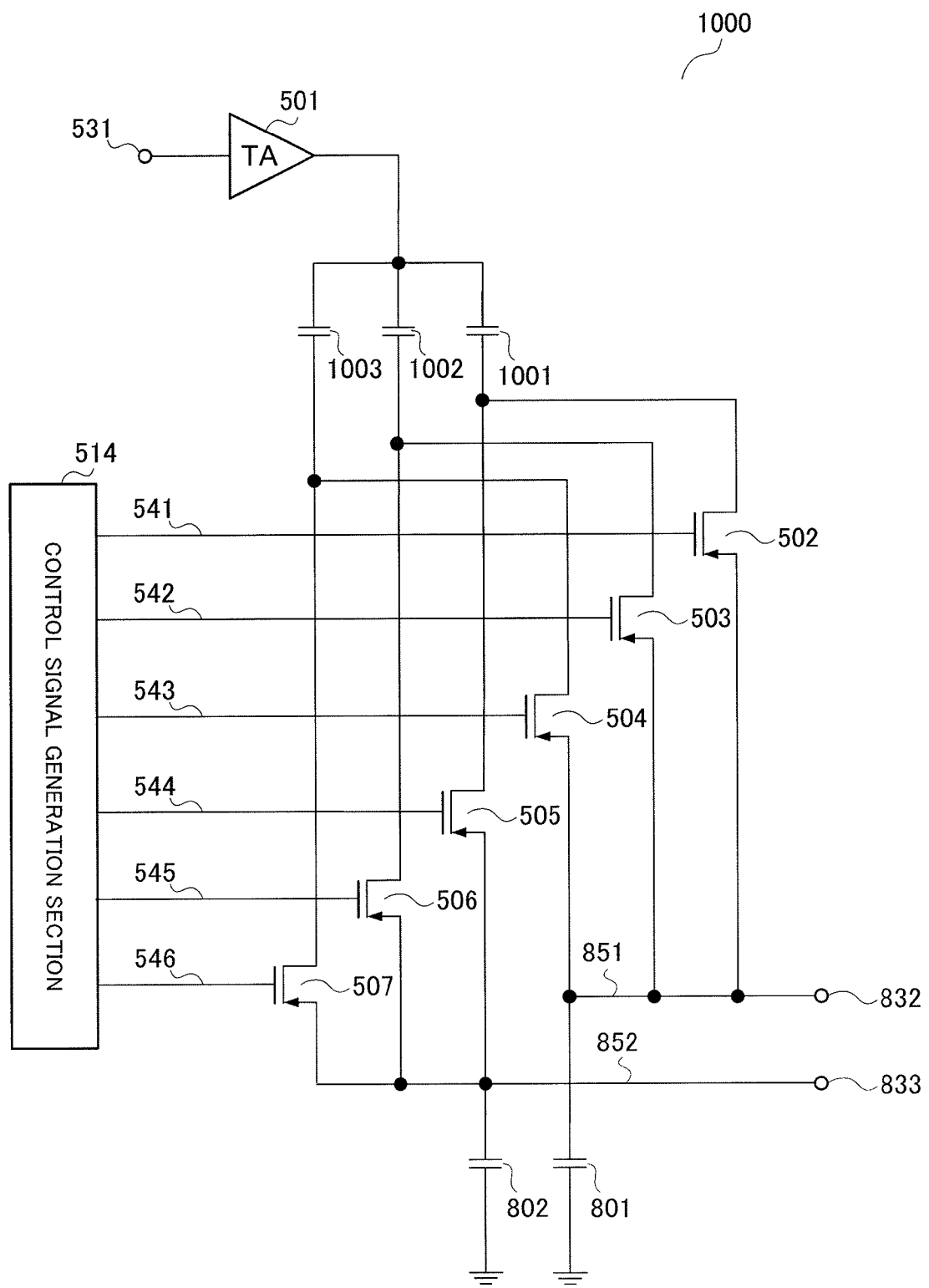
FIG. 17 shows an example of a multiphase mixer according to Embodiment 6.

FIG. 17 shows an example of the configuration of a multiphase mixer according to this embodiment. As shown in FIG. 17, multiphase mixer 1000 is provided with TA 501, mixer 502, mixer 503, mixer 504, mixer 505, mixer 506, mixer 507, capacitance 801, capacitance 802, control signal generation section 514, capacitance 1001, capacitance 1002, and capacitance 1003, performs frequency conversion of a signal input from input terminal 531, and outputs output signal 851 from output terminal 832, and output signal 852 from output terminal 833. Here, the operation and function of configuration elements assigned the same reference numbers as in FIG. 13 of Embodiment 4 are identical to those in FIG. 13, and descriptions thereof are omitted.

Capacitance 1001 is a capacitance for performing capacitive coupling between TA 501 and mixer 502 and mixer 505. Capacitance 1002 is a capacitance for performing capacitive coupling between TA 501 and mixer 503 and mixer 506. Capacitance 1003 is a capacitance for performing capacitive coupling between TA 501 and mixer 504 and mixer 507. Below, capacitance 1001, capacitance 1002, and capacitance 1003 are referred to as first integration elements, and capacitance 801 and capacitance 802 are referred to as second integration elements.

As a result of driving multiphase mixer 1000 using the control signals shown in FIG. 9, output signal 851 and output signal 852 having a 180-degree phase difference relationship in a post-frequency-conversion baseband are output to output terminal 832 and output terminal 833, respectively.

At this time, mixer 502, mixer 503, and mixer 504 connected to capacitance 801 are controlled by driving signals comprising pulse trains with adjacent on-periods. Also, mixer 505, mixer 506, and mixer 507 connected to capacitance 802 are controlled by driving signals comprising pulse trains with adjacent on-periods.

As the current charging time for capacitance 801 and capacitance 802 is ½ of a local oscillation signal cycle, an attenuation pole due to a current integration effect is generated at a frequency that is an even multiple of the local oscillation signal frequency.

Figure 18:
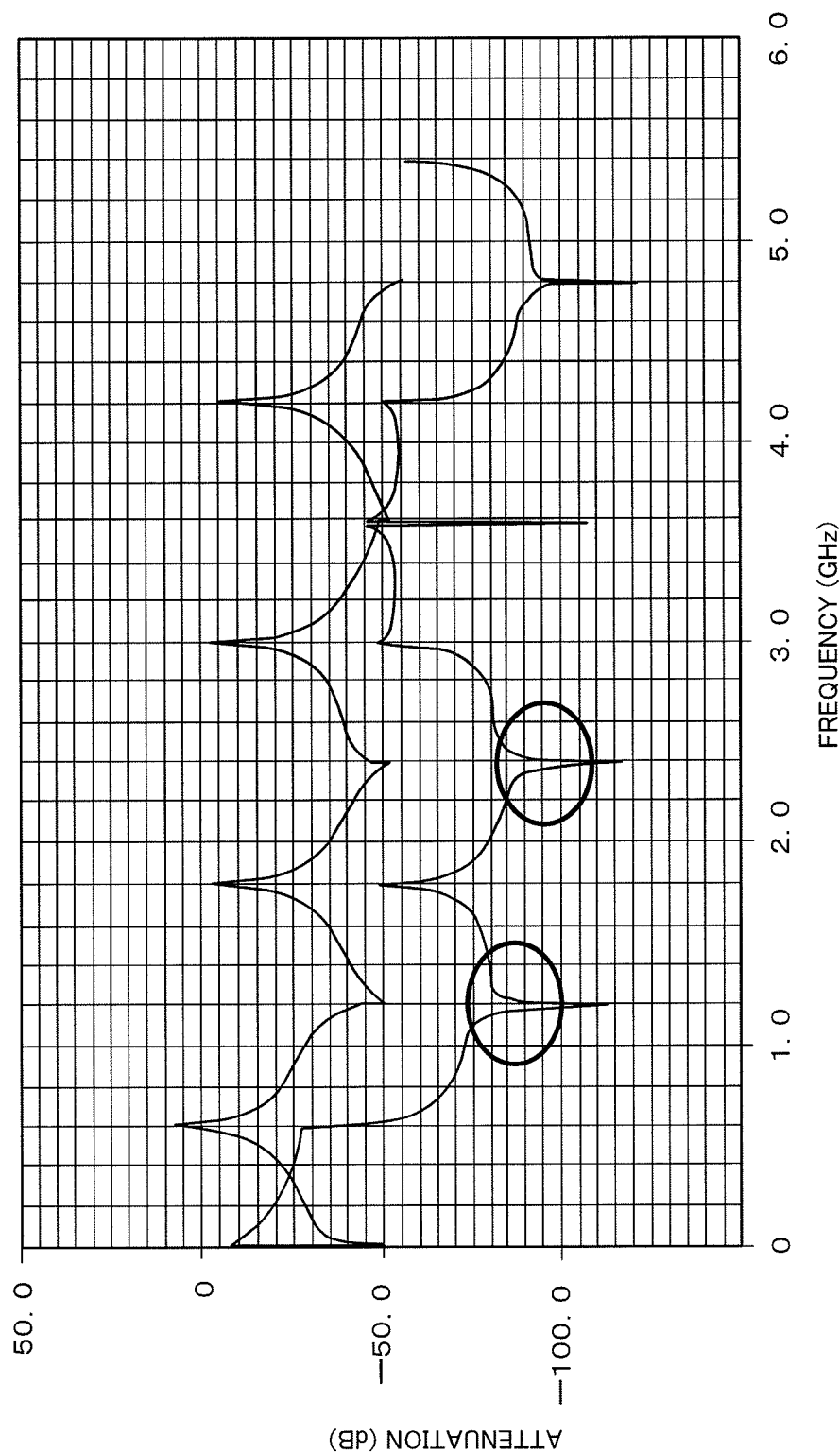
FIG. 18 shows an attenuation characteristic simulation result for the multiphase mixer in FIG. 17.

Also, capacitance 1001, capacitance 1002, and capacitance 1003 selectively use a charge accumulated in a parasitic capacitance that performs charge sharing with a load capacitance while a mixer is activated by coupling mixers driven by control signals with a 180-degree phase difference on one side of a capacitance from among mixers driven by control signals with different phases. That is to say, as described in Embodiment 2, an attenuation pole can be generated at a frequency that is an even multiple of the local oscillation signal in addition to an attenuation pole due to a current integration effect, and attenuation can be improved. For example, an attenuation pole due to a current integration effect is generated at a frequency that is an even multiple of the local oscillation signal, as ringed with a solid line in FIG. 18. For example, in FIG. 18, an attenuation pole due to a current integration effect is generated at a frequency of 1.2 GHz, twice the local oscillation signal frequency of 600 MHz. Here, FIG. 18 shows an attenuation characteristic simulation result for multiphase mixer 1000 in FIG. 17. Also, since the multiphase mixer shown in FIG. 17 is driven only by control signals with a duty ratio of 1/6, it has an effect of suppressing self-mixing.

In this embodiment, control signals with a duty ratio of 1/6 are used, but this is not a limitation, and control signals with a duty ratio of less than 1/6 may also be used.

Embodiment 7

This embodiment is a combination of Embodiment 2 and Embodiment 5.

Figure 19:
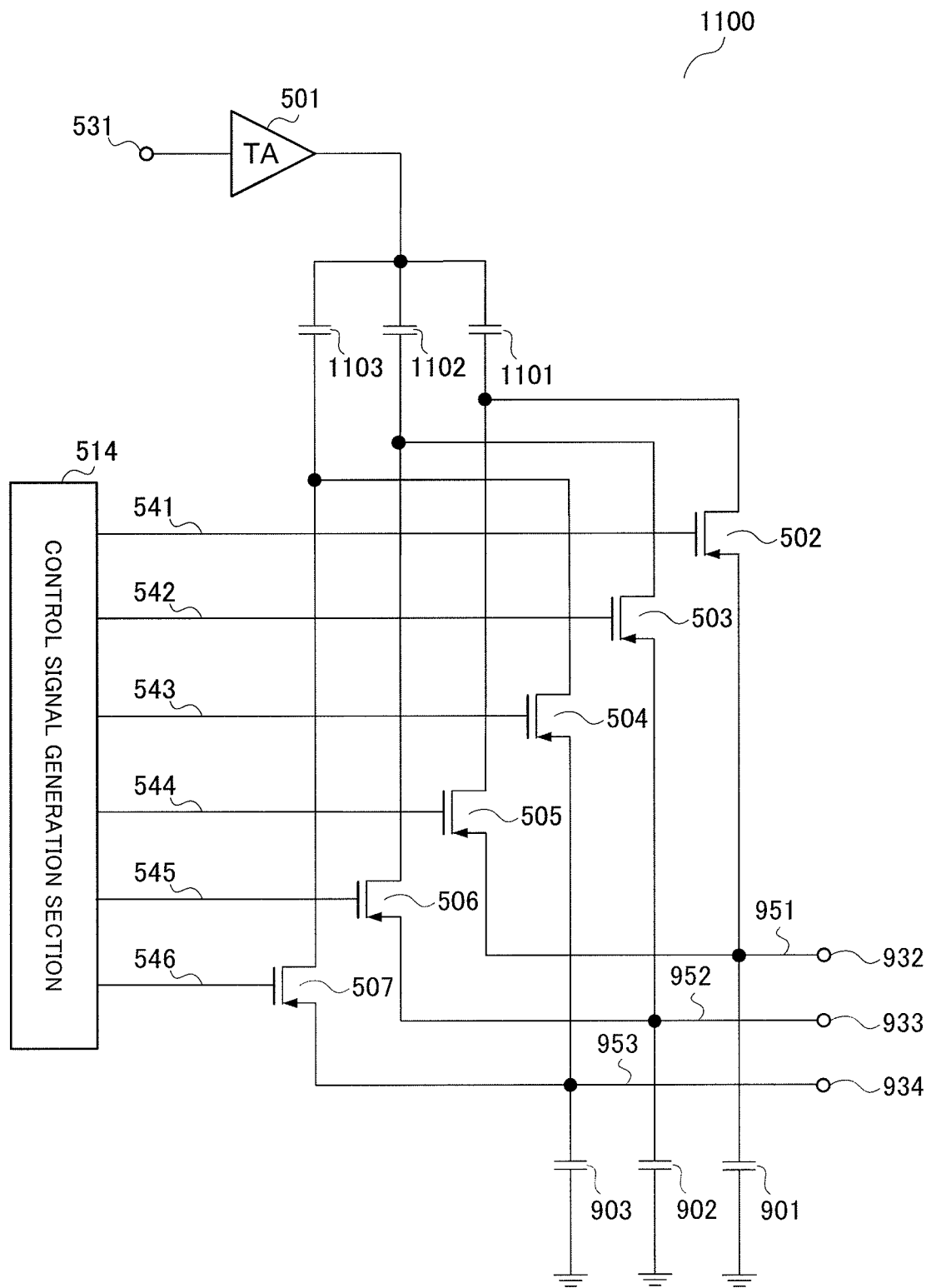
FIG. 19 shows an example of a multiphase mixer according to Embodiment 7.

FIG. 19 shows an example of the configuration of a multiphase mixer according to this embodiment. As shown in FIG. 19, multiphase mixer 1100 is provided with TA 501, mixer 502, mixer 503, mixer 504, mixer 505, mixer 506, mixer 507, capacitance 901, capacitance 902, capacitance 903, control signal generation section 514, capacitance 1101, capacitance 1102, and capacitance 1103, performs frequency conversion of a signal input from input terminal 531, and outputs output signal 951 from output terminal 932, output signal 952 from output terminal 933, and output signal 953 from output terminal 934. Here, the operation and function of configuration elements assigned the same reference numbers as in FIG. 15 of Embodiment 5 are identical to those in FIG. 15, and descriptions thereof are omitted.

Capacitance 1101 is a capacitance for performing capacitive coupling between TA 501 and mixer 502 and mixer 505. Capacitance 1102 is a capacitance for performing capacitive coupling between TA 501 and mixer 503 and mixer 506. Capacitance 1103 is a capacitance for performing capacitive coupling between TA 501 and mixer 504 and mixer 507. The current charging time for capacitance 901 and capacitance 902 is ⅓ of a local oscillation signal cycle, and therefore an attenuation pole due to a current integration effect is generated at a frequency that is a constant 3 multiple of the local oscillation signal frequency. Below, capacitance 1101, capacitance 1102, and capacitance 1103 are referred to as first integration elements, and capacitance 901, capacitance 902, and capacitance 903 are referred to as second integration elements.

As a result of driving multiphase mixer 1100 using the control signals shown in FIG. 9, mixer 502 and mixer 505 connected to capacitance 901 are controlled by driving signals comprising pulse trains with an on-period phase difference of 180°, mixer 503 and mixer 506 connected to capacitance 902 are controlled by driving signals comprising pulse trains with an on-period phase difference of 180°, and mixer 505 and mixer 507 connected to capacitance 903 are controlled by driving signals comprising pulse trains with an on-period phase difference of 180°.

Figure 20:
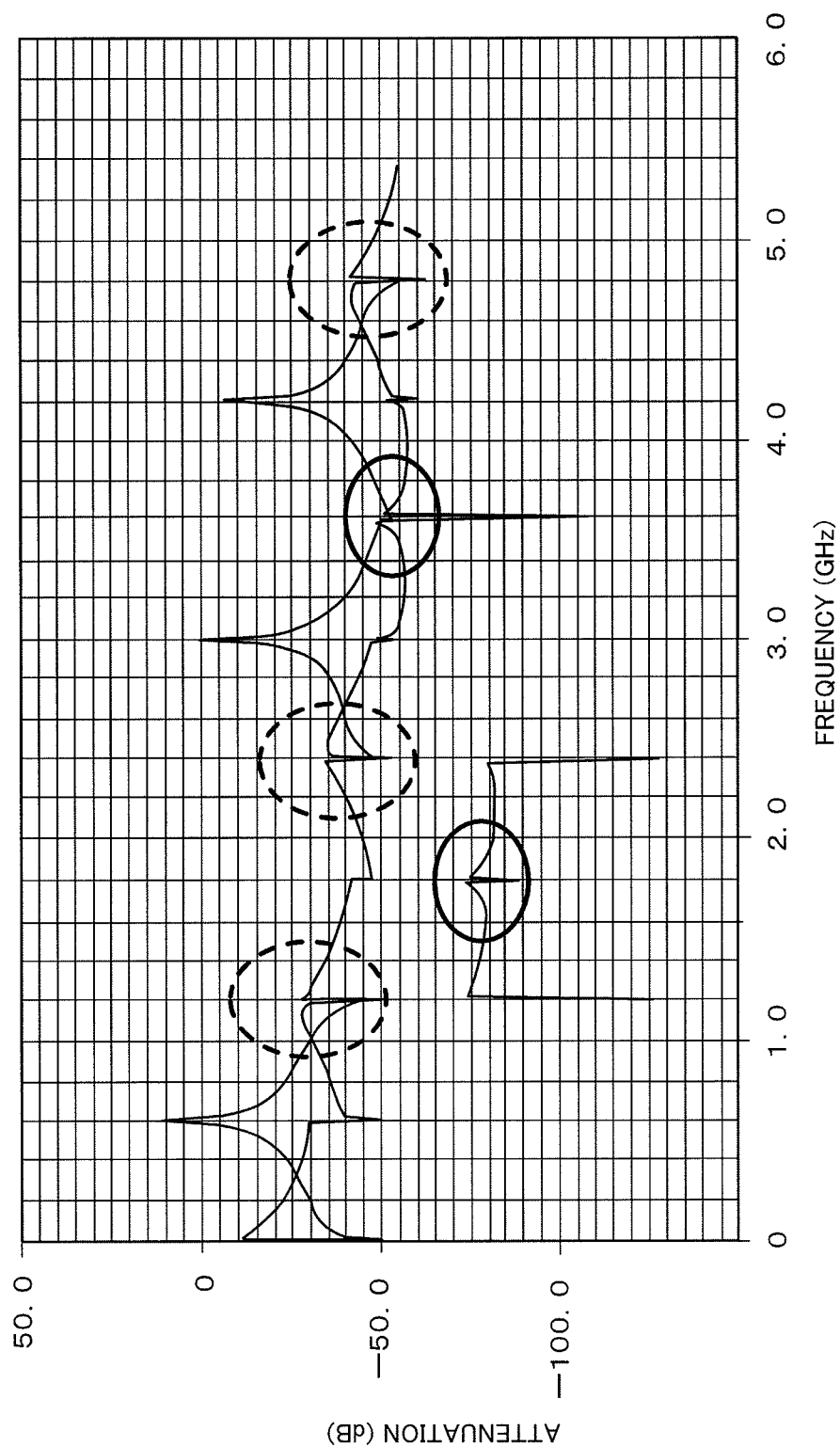
FIG. 20 shows an attenuation characteristic simulation result for the multiphase mixer in FIG. 19.

Also, capacitance 1101, capacitance 1102, and capacitance 1103 selectively use a charge accumulated in a parasitic capacitance that performs charge sharing with a load capacitance while a mixer is activated by coupling mixers driven by control signals with a 180-degree phase difference on one side of a capacitance from among mixers driven by control signals with different phases. That is to say, as described in Embodiment 2, an attenuation pole can be generated at a frequency that is an even multiple of the local oscillation signal in addition to an attenuation pole due to a current integration effect. For example, as shown in FIG. 20, in addition to an attenuation pole due to a current integration effect present in a part ringed with a solid line, an attenuation pole (a part ringed with a dotted line) is generated at a frequency that is an even multiple of the local oscillation signal. In the example shown in FIG. 20, an attenuation pole is generated at a frequency of 1.2 GHz, twice the local oscillation signal frequency of 600 MHz. Here, FIG. 20 shows an attenuation characteristic simulation result for multiphase mixer 1100 in FIG. 19. Also, since the multiphase mixer shown in FIG. 19 is driven only by control signals with a duty ratio of 1/6, it has an effect of suppressing self-mixing.

In this embodiment, control signals with a duty ratio of 1/6 are used, but this is not a limitation, and control signals with a duty ratio of less than 1/6 may also be used.

Embodiment 8

In this embodiment, a configuration is described whereby, in a 4-phase mixer that is driven using control signals with a duty ratio of 25%, frequency conversion is executed based on a frequency that is twice the control signal frequency by charging the same load capacitance with outputs of mixers activated by a 180-degree phase difference.

Figure 21:
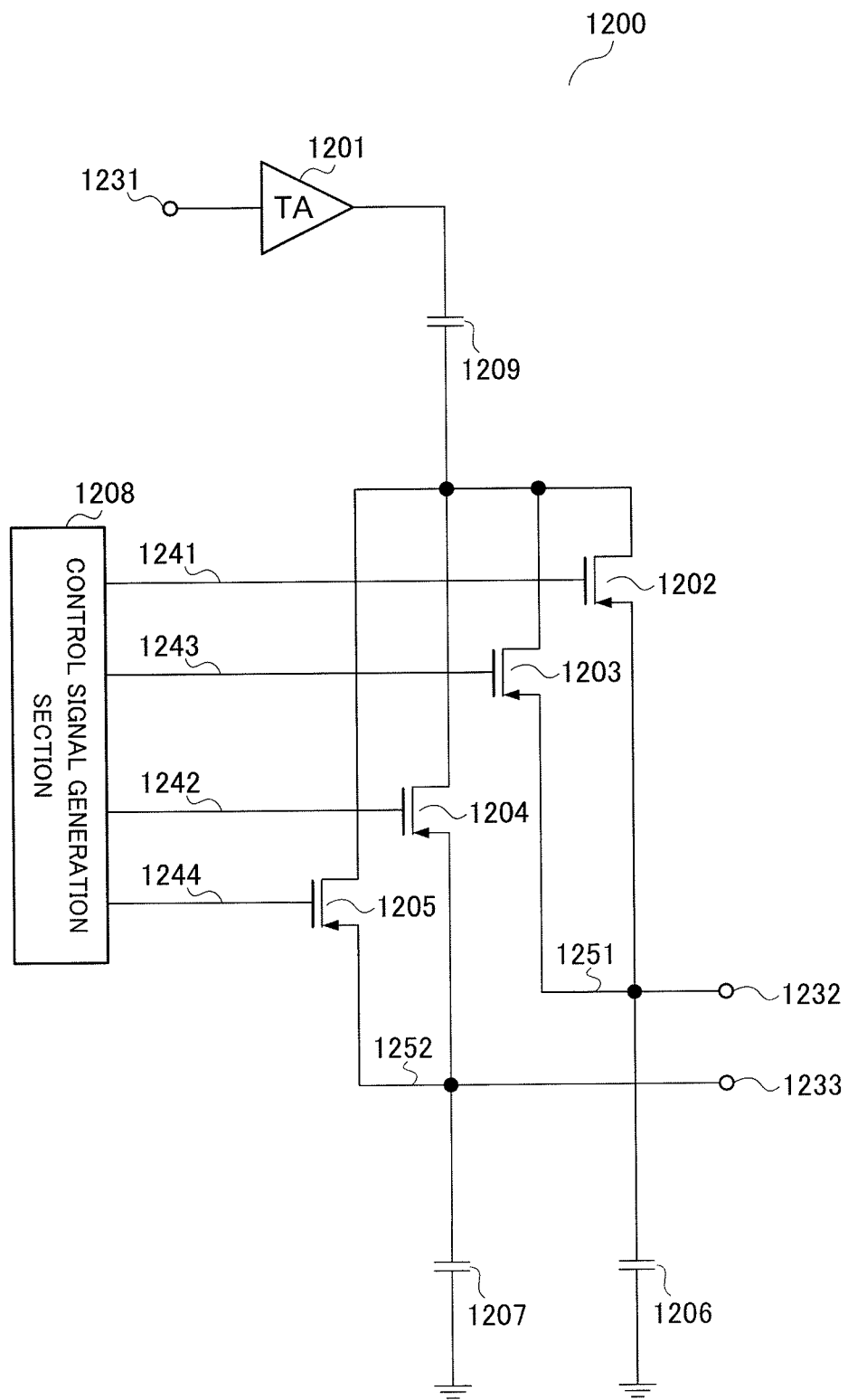
FIG. 21 shows an example of a multiphase mixer according to Embodiment 8.

FIG. 21 shows an example of the configuration of a multiphase mixer according to this embodiment.

As shown in FIG. 21, multiphase mixer 1200 is provided with TA 1201, mixer 1202, mixer 1203, mixer 1204, mixer 1205, capacitance 1206, capacitance 1207, control signal generation section 1208, and capacitance 1209, performs frequency conversion of a signal input from input terminal 1231, and outputs output signal 1251 from output terminal 1232, and output signal 1252 from output terminal 1233. Below, capacitance 1209 is referred to as a first integration element, and capacitance 1206 and capacitance 1207 are referred to as second integration elements.

TA 1201 converts an alternating voltage input from input terminal 1231 to an alternating current. Mixer 1202 is connected to TA 1201, and is driven by control signal 1241 output from control signal generation section 1208. Mixer 1203 is connected to TA 1201, and is driven by control signal 1243 output from control signal generation section 1208. Mixer 1204 is connected to TA 1201, and is driven by control signal 1242 output from control signal generation section 1208. Mixer 1205 is connected to TA 1201, and is driven by control signal 1244 output from control signal generation section 1208.

Mixer 1202, mixer 1203, mixer 1204, and mixer 1205 are driven by control signals, and charge capacitance 1206 and capacitance 1207 with an alternating current output from TA 1201 only while in an active state. That is to say, a current output from TA 1201 is distributed to and charges capacitance 1206 and capacitance 1207 by means of mixer 1202, mixer 1203, mixer 1204, and mixer 1205 driven by control signals.

Below, the block comprising mixer 1202, mixer 1203, mixer 1204, and mixer 1205 is referred to as the mixer block.

Capacitance 1206 is a load corresponding to mixer 1202 and mixer 1203, and capacitance 1207 is a load corresponding to mixer 1204 and mixer 1205.

Capacitance 1209 is a capacitance for performing capacitive coupling between TA 1201 and mixer 1202, mixer 1203, mixer 1204, and mixer 1205.

Figure 22:
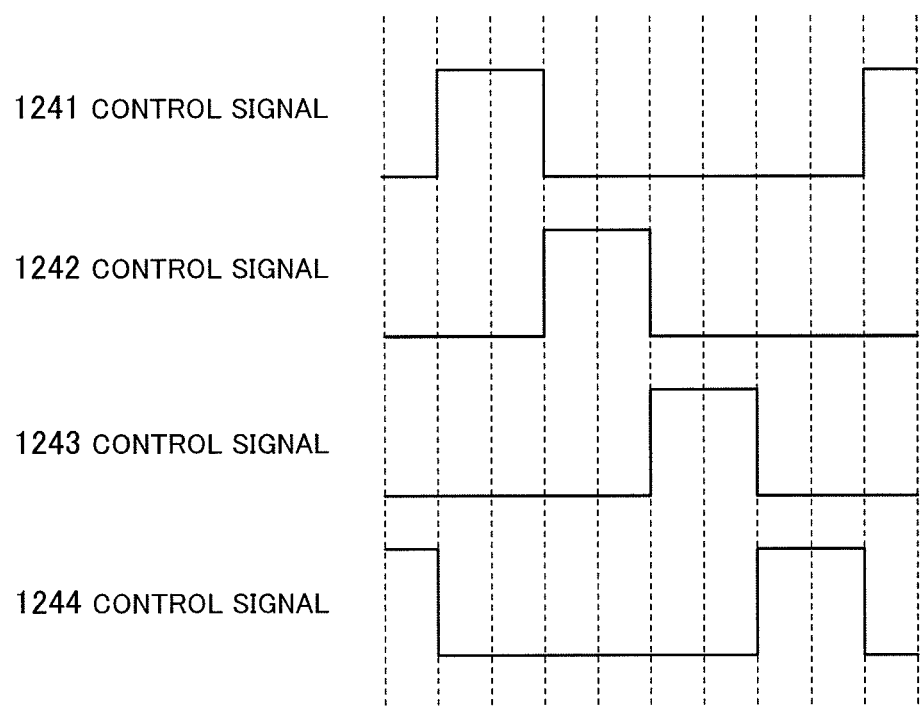
FIG. 22 shows control signal waveforms of a 4-phase mixer according to Embodiment 8.

FIG. 22 shows time waveforms of control signal 1241, control signal 1242, control signal 1243, and control signal 1244. Control signal 1241, control signal 1242, control signal 1243, and control signal 1244 are rectangular waves with an identical cycle having a duty ratio of 1/4, and their waveforms should preferably be shaped so that there is no Hi interval overlapping among different control signals (that is, subjected to non-overlap waveform shaping). As a result of driving multiphase mixer 1200 using such control signals, output signal 1251 and output signal 1252 having a 180-degree phase difference relationship in a post-frequency-conversion baseband are output to output terminal 1232 and output terminal 1233 respectively.

Figure 23:
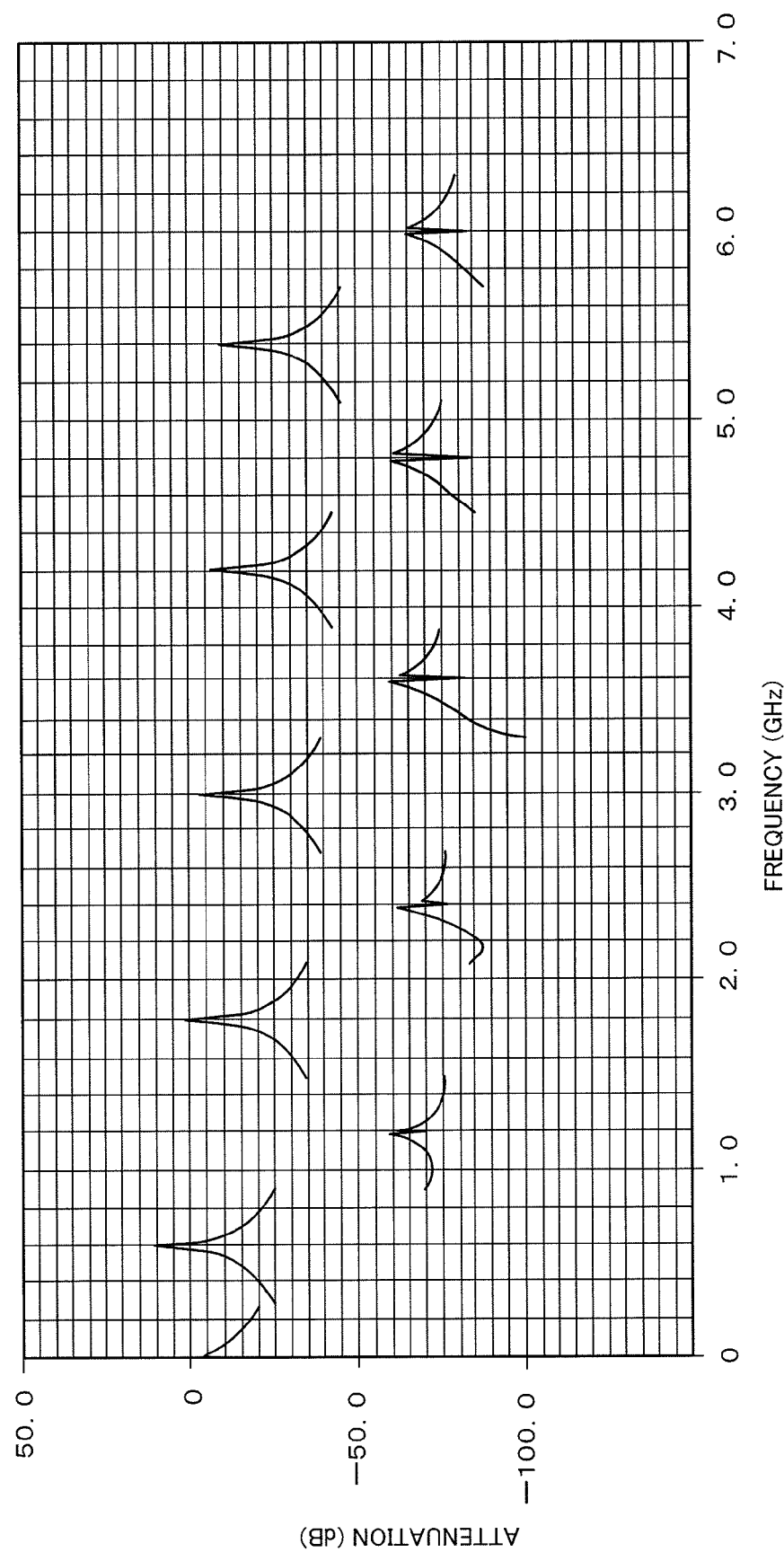
FIG. 23 shows an attenuation characteristic simulation result for the multiphase mixer in FIG. 21.

Here, the current charging frequency for capacitance 1206 and capacitance 1207 is a multiple of the control signal cycle, and frequency conversion is executed at a frequency that is a multiple of the control signal frequency. For example, FIG. 23 shows an attenuation characteristic simulation result for multiphase mixer 1200 in FIG. 21 when the control signal frequency is 300 MHz (control signal cycle: ⅟300 MHz). As shown in FIG. 23, a fundamental response is output at a frequency that is a multiple of the control signal frequency.

In this embodiment, control signals with a duty ratio of 1/4 are used, but this is not a limitation, and control signals with a duty ratio of less than 1/4 may also be used.

Also, in this embodiment, capacitance 1209 is used to perform capacitive coupling between TA 1201 and the mixer block, but this is not a limitation, and TA 1201 and the mixer block may be directly connected without the intermediation of capacitive coupling.

In Embodiment 1 through Embodiment 8, examples have been shown in which NMOS switches are used as mixers, but a configuration employing PMOS switches or CMOS switches using PMOS and NMOS in a complementary fashion may also implemented. Connections may also be made with the source terminal and drain terminal reversed. With NMOS switches being used, the description has assumed that a mixer is placed in an active state while a control signal is Hi (in the high period of a rectangular pulse), but if a PMOS configuration or a CMOS configuration with PMOS and NMOS utilized in a complementary fashion is used for a mixer, it goes without saying that a mixer using PMOS can be placed in an active state by reading "Hi period" as "Low period" (the low period of a rectangular pulse) in the description. In any case, a period during which a mixer is in an active state can be referred to as an on-period, and a period during which a mixer is in an inactive state can be referred to as an off-period.

Also, in Embodiment 1 through Embodiment 8, it has been assumed that a TA input signal is a single-phase input, but this is not a limitation, and provision may also be made for a differential input signal to be utilized using a differential-configuration TA, and for mixers to be arranged to suit a differential input signal and for a TA input signal to be made a differential input.

Furthermore, a direct sampling circuit may be configured by connecting a sampling circuit shown in Non-Patent Literature 7, for example, to a subsequent stage of a multiphase mixer shown in Embodiment 1 through Embodiment 8.

The disclosure of Japanese Patent Application No. 2009-017899, filed on Jan. 29, 2009, including the specification, drawings and abstract, is incorporated herein by reference in its entirety.

INDUSTRIAL APPLICABILITY

A multiphase mixer of the present invention is suitable for use in a self-mixing suppression technology for a mixer used in a high frequency processing section in a radio communication system, a mixer harmonic response suppression technology, and so forth.

REFERENCE SIGNS LIST

100, 300, 400, 500, 700, 800, 900, 1000, 1100, 1200 Multiphase mixer
101, 501, 1201 TA
102, 103, 104, 105, 502, 503, 504, 505, 506, 507, 1202, 1203, 1204, 1205 Mixer
106, 107, 108, 109, 301, 401, 402, 508, 509, 510, 511, 512, 513, 515, 516, 517, 701, 702, 801, 802, 803, 901, 902, 903, 1001, 1002, 1003, 1101, 1102, 1103, 1206, 1207, 1209 Capacitance
110, 514, 1208 Control signal generation section
131, 531, 1231 Input terminal
132, 133, 134, 135, 532, 533, 534, 535, 536, 537, 732, 733, 832, 833, 932, 933, 934, 1232, 1233 Output terminal
141, 142, 143, 144, 541, 542, 543, 544, 545, 546, 1241, 1242, 1243, 1244 Control signal
151, 152, 153, 154, 551, 552, 553, 554, 555, 556, 751, 752, 851, 852, 951, 952, 953, 1251, 1252 Output signal

The invention claimed is:

1. A multiphase mixer, comprising:
a transconductance amplifier that converts a voltage signal to a current signal;
N (where N is a natural number of two or more) first integration elements connected in parallel to a subsequent stage of the transconductance amplifier; and
2N mixers connected in parallel in pairs to the respective N first integration elements, wherein two mixers connected to an identical integration element of any of the N first integration elements are controlled by driving signals comprising pulse trains having an identical frequency and phases differing by 180°,
wherein each of the driving signals controlling the 2N mixers has an on-period ratio of 100/2N (%) with respect to one cycle.

2. A multiphase mixer, comprising:
a transconductance amplifier that converts a voltage signal to a current signal;
N (where N is a natural number of two or more) first integration elements connected in parallel to a subsequent stage of the transconductance amplifier; and
2N mixers connected in parallel in pairs to the respective N first integration elements, wherein two mixers connected to an identical integration element of any of the N first integration elements are controlled by driving signals comprising pulse trains having an identical frequency and phases differing by 180°,
wherein the 2N mixers are controlled by driving signals comprising pulse trains having an identical frequency and phases differing by)180/N(°); and
wherein, of the 2N mixers, N mixers controlled by driving signals comprising pulse trains whose on-periods are adjacent are connected to an identical second integration element.

3. A multiphase mixer, comprising:
a transconductance amplifier that converts a voltage signal to a current signal;
N (where N is a natural number of two or more) first integration elements connected in parallel to a subsequent stage of the transconductance amplifier; and
2N mixers connected in parallel in pairs to the respective N first integration elements, wherein two mixers connected to an identical integration element of any of the N first integration elements are controlled by driving signals comprising pulse trains having an identical frequency and phases differing by 180°,
wherein the 2N mixers are controlled by driving signals comprising pulse trains having an identical frequency and phases differing by 180/N(°); and
wherein, of the 2N mixers, two mixers controlled by driving signals comprising pulse trains whose on-period phase difference is 180° are connected to an identical second integration element.

4. The multiphase mixer according to claim 1, wherein the 2N mixers are controlled by driving signals comprising pulse trains that are not in an on state simultaneously.

5. The multiphase mixer according to claim 1, wherein the N is 2.

6. The multiphase mixer according to claim 1, wherein the N is 3.

7. A multiphase mixer comprising:
- a transconductance amplifier that converts a voltage signal to a current signal;
- a first integration element connected in parallel to a subsequent stage of the transconductance amplifier; and
- M (where M is a natural number of two or more) mixers connected in parallel with respect to the first integration element, and controlled by driving signals comprising pulse trains having an identical frequency and phases differing by L° (where L is a positive value less than 180), wherein:
- a value obtained by multiplying L by M is 360; and
- of the M mixers, P (where P is a natural number less than M) mixers controlled by driving signals comprising pulse trains whose on-periods are adjacent are connected to an identical second integration element.

8. The multiphase mixer according to claim 7, wherein each of the driving signals controlling the M mixers has an on-period ratio of 100/M (%) with respect to one cycle.

9. The multiphase mixer according to claim 7, wherein the M mixers are controlled by driving signals comprising pulse trains that are not in an on state simultaneously.

10. The multiphase mixer according to claim 7, wherein the L is 90, the M is 4, and the P is 2.

11. The multiphase mixer according to claim 7, wherein the L is 60, the M is 6, and the P is 3.

12. A multiphase mixer comprising:
- a transconductance amplifier that converts a voltage signal to a current signal;
- a first integration element connected in parallel to a subsequent stage of the transconductance amplifier; and
- M (where M is a natural number of two or more) mixers connected in parallel with respect to the first integration element, and controlled by driving signals comprising pulse trains having an identical frequency and phases differing by L° (where L is a positive value less than 180), wherein:
- a value obtained by multiplying L by M is 360; and
- of the M mixers, two mixers controlled by driving signals comprising pulse trains whose on-period phase difference is 180° are connected to an identical second integration element.

13. The multiphase mixer according to claim 12, wherein each of the driving signals controlling the M mixers has an on-period ratio of 100/M (%) with respect to one cycle.

14. The multiphase mixer according to claim 12, wherein the M mixers are controlled by driving signals comprising pulse trains that are not in an on state simultaneously.

* * * * *